(12) United States Patent
Nezuka

(10) Patent No.: US 10,158,369 B2
(45) Date of Patent: Dec. 18, 2018

(54) A/D CONVERTER

(71) Applicant: DENSO CORPORATION, Kariya, Aichi-pref. (JP)

(72) Inventor: Tomohiro Nezuka, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/739,206

(22) PCT Filed: Jul. 14, 2016

(86) PCT No.: PCT/JP2016/070760
§ 371 (c)(1),
(2) Date: Dec. 22, 2017

(87) PCT Pub. No.: WO2017/038262
PCT Pub. Date: Mar. 9, 2017

(65) Prior Publication Data
US 2018/0212616 A1  Jul. 26, 2018

(30) Foreign Application Priority Data
Sep. 3, 2015 (JP) .................................. 2015-173922

(51) Int. Cl.
*H03M 1/38* (2006.01)
*H03M 1/12* (2006.01)
(Continued)

(52) U.S. Cl.
CPC ......... *H03M 1/1245* (2013.01); *H03M 1/466* (2013.01); *H03M 1/52* (2013.01); *H03M 1/54* (2013.01); *H03M 3/454* (2013.01)

(58) Field of Classification Search
CPC ...... H03M 1/164; H03M 1/0695; H03M 1/12; H03M 1/0641; H03M 1/46; H03M 1/468;
(Continued)

(56) References Cited

U.S. PATENT DOCUMENTS

| 4,768,019 A | 8/1988 | Linder |
|---|---|---|
| 5,101,206 A | 3/1992 | Riedel |

(Continued)

FOREIGN PATENT DOCUMENTS

| JP | S62-265820 A | 11/1987 |
|---|---|---|
| JP | H02-246622 A | 10/1990 |
| JP | 2014-146893 A | 8/2014 |

OTHER PUBLICATIONS

Chao, Kirk C.-H. et al. "A Higher Order Topology for Interpolative Modulators for Oversampling A/D Converters," IEEE Transactions on Circuits and Systems, vol. 37, No. 3, pp. 309-318 (Mar. 1990). (Discussed on p. 2 in the specification.).

(Continued)

*Primary Examiner* — Linh Nguyen
(74) *Attorney, Agent, or Firm* — Posz Law Group, PLC

(57) ABSTRACT

An A/D converter is provided with: an integrator that includes an operational amplifier provided with a first input terminal and an output terminal, and an integration capacitor; a quantizer that outputs a quantization result obtained by quantizing an output signal from the operational amplifier; and a DAC that is connected to the first input terminal and determines DAC voltage. The integrator has a feedback switch between the integration capacitor and the output terminal of the operational amplifier. An analog signal as an input signal is inputted between the integration capacitor and the feedback switch. The integration capacitor samples the analog signal. The quantizer performs the quantization based on the output of the operational amplifier. The DAC sequentially subtracts electric charge accumulated in the integration capacitor to thereby change the analog signal to a digital value.

16 Claims, 12 Drawing Sheets

(51) Int. Cl.
   *H03M 1/54*   (2006.01)
   *H03M 1/46*   (2006.01)
   *H03M 1/52*   (2006.01)
   *H03M 3/00*   (2006.01)

(58) Field of Classification Search
   CPC .... H03M 1/442; H03M 1/0668; H03M 1/145;
        H03M 1/167; H03M 1/201; H03M 1/44;
        H03M 1/462; H03M 1/466; H03M 1/1245
   USPC ................................ 341/155, 161, 162, 172
   See application file for complete search history.

(56) References Cited

U.S. PATENT DOCUMENTS

| | | | |
|---|---|---|---|
| 5,117,227 A * | 5/1992 | Goeke | H03M 1/50 341/156 |
| 5,189,419 A | 2/1993 | Lyden | |
| 5,844,514 A | 12/1998 | Ringh et al. | |
| 6,016,115 A | 1/2000 | Heubi | |
| 6,243,034 B1 | 6/2001 | Regier | |
| 6,784,823 B1 | 8/2004 | Koike | |
| 6,999,014 B2 | 2/2006 | Oliaei et al. | |
| 7,068,202 B2 * | 6/2006 | Waltari | H03M 1/1245 327/158 |
| 7,629,917 B2 * | 12/2009 | Shinohara | H03M 1/002 341/118 |
| 7,916,061 B2 | 3/2011 | Chae et al. | |
| 8,232,905 B2 | 7/2012 | Steensgaard-Madsen | |
| 8,810,443 B2 | 8/2014 | Steengaard-Madsen | |
| 8,836,567 B2 | 9/2014 | Lin | |
| 2008/0258951 A1 * | 10/2008 | Doorenbos | H03M 1/145 341/143 |
| 2009/0102695 A1 * | 4/2009 | Kawahito | H03M 1/08 341/172 |
| 2010/0182176 A1 * | 7/2010 | Kawahito | H03M 1/00 341/122 |
| 2012/0007762 A1 * | 1/2012 | Garrity | H03M 1/40 341/163 |
| 2012/0250781 A1 * | 10/2012 | Rud | H03M 1/181 375/295 |
| 2013/0082766 A1 * | 4/2013 | Chen | H03M 3/396 327/557 |
| 2014/0062742 A1 * | 3/2014 | Nakanishi | H03M 1/0656 341/122 |
| 2014/0292409 A1 * | 10/2014 | Nishimura | H03M 1/1061 330/252 |
| 2016/0028412 A1 * | 1/2016 | Liu | H03M 1/0836 341/122 |

OTHER PUBLICATIONS

Agnes, Andrea et al. "High-Resolution Multi-Bit Incremental Converter with 1.5-µV Residual Offset and 94-dB SFDR," The 2010 IEEJ International Workshop on AVLSI, Pavia, Italy.

* cited by examiner

A/D CONVERTER

CROSS REFERENCE TO RELATED APPLICATIONS

The present application is a U.S. national stage application of International Application No. PCT/JP2016/070760 filed on Jul. 14, 2016 and is based on Japanese Patent Application No. 2015-173922 filed on Sep. 3, 2015, the disclosures of which are incorporated herein by reference.

TECHNICAL FIELD

The present disclosure relates to an A/D convertor that enables to implement A/D conversion with a high speed and high accuracy in a simple configuration.

BACKGROUND

In a background related to an environment problem and an energy problem, a demand that a vehicle or an industrial apparatus are controlled faster and higher accurately to suppress an exhausted gas or to reduce an amount of energy used increases. A digitalization of a control circuit to control the vehicle and the industrial apparatus has been advanced. In general, an analog signal outputted by a sensor that detects a physical condition of an apparatus is converted to a digital signal by an A/D (analog/digital) convertor (ADC), and then the apparatus is controlled with a result of digital signal process. Therefore, a demand to a high speed and high accurate ADC has grown.

For example, in order to reduce the nonlinearity error of the A/D conversion caused by an error of a capacity value of a capacitive element configuring an ADC, a successive approximation register (SAR) type ADC in Patent Literature 1 is configured to perform a dithering to the capacity used when the A/D conversion is performed.

On the other hand, the ADC as described in Patent Literature 2 and Non-patent Literature 1 is a delta sigma type A/D convertor that has implemented high accuracy by using a delta sigma (ΔΣ) modulation.

In addition, the A/D convertor as described in Patent Literature 3 is an incremental delta (incremental Δ) type A/D convertor to vary a feedback amount by an analog quantizer.

Patent Literature

Patent Literature 1: U.S. Pat. No. 8,810,443 B2
Patent Literature 2: U.S. Pat. No. 5,189,419 A
Patent Literature 3: U.S. Pat. No. 6,999,014 B2

Non-Patent Literature

Non-patent Literature 1: K. C.-H. Chao, S. Nadeem, W. L. Lee, and C. G. Sodini, "A Higher Order Topology for Interpolative Modulators for Oversampling A/D Converter", IEEE Transactions on Circuits and Systems, Vol. 37, No. 3, March 1990

SUMMARY

In the A/D convertor as described in Patent Literature 1, a method of referred to as a dithering is used to improve accuracy. Although the dithering can apparently reduce the error of a capacitance by dispersing the error in a time direction, it is impossible to completely eliminate the error dispersed in the time direction. An additional control mechanism is necessary to perform the dithering. Element area and power consumption may increase.

As a method to improve accuracy other than the dithering, a trimming is widely used. The trimming is the method that after measuring the error of the element, a correction value corresponding to the error of the element is recorded and an A/D conversion result is corrected based on the correction value. However, to perform the trimming, memory element to record the correction value and a correction mechanism to perform a correction based on the recorded correction value are required additionally.

Furthermore, in a circuit configuration using a capacitance DAC, which is in a main stream of the SAR type A/D convertor, in order to improve accuracy, it is necessary to improve the ratio accuracy of the capacitive element used in the capacitance DAC, and total capacitance value should relatively increase. Therefore, in a process of the A/D conversion, since the capacitance DAC having a large capacity value is driven by using a reference voltage. Therefore, in a state that it is impossible to supply the reference voltage with sufficiently low impedance, a relatively long time is necessary in a settling of the reference voltage. That is, as the capacitance value enlarges in order to improve accuracy, making high speed may be difficult.

According to the delta sigma type A/D convertor as described in Non-patent Literature 1, an oversampling is necessary to improve accuracy. However, it is common to perform the oversampling in frequency higher than from one to two digits of magnitude in comparison to a desired signal band. In addition, an operation frequency of the circuit often limits a conversion speed. When an input signal source in a preceding stage of the A/D convertor does not have a low output impedance required to perform the oversampling at a high speed over, a high speed buffer is necessary. Therefore, the operation frequency of a buffer often limits the conversion speed. When the oversampling is performed and a high-order ΔΣ modulation is used to improve speed and accuracy, the result after a filter process to the input signal at multiple different sampling times is outputted as the A/D conversion result. Thus, for example, it may be unsuitable for use of application controlling an apparatus with only use of a magnitude of the input signal at a specific time.

Such as the delta sigma type A/D convertor as described in Patent Literature 2, by combining a nyquist A/D convertor with the digital sigma A/D convertor, the A/D convertor providing to improve both speed and accuracy is also known. In the A/D convertor, the ΔΣ modulation produces most significant bits (MSBs) of the A/D conversion result, and the nyquist A/D convertor produces least significant bits (LSBs) of the A/D conversion result, which provide to improve accuracy and speed. However, the A/D convertor also performs the oversampling in the ΔΣ modulator, which is in the preceding stage. Hence, similar to the ΔΣ modulator without combining the nyquist A/D convertor, the operation frequency of the buffer prior to the A/D convertor becomes high and the A/D conversion result of the input signal at a specific time is not obtained.

As described in Patent Literature 3, the incremental delta type A/D convertor, that uses a delta modulation as a basic principle, is proposed so that the difficulty of the delta sigma type A/D convertor is solved. The delta modulation used in the A/D conversion has a difficulty that the number of cycles needed for the A/D conversion exponentially increases with making high resolution. Therefore, the DAC using multiple reference voltages that are different each other is used in feedback so that the A/D conversion becomes high speed by reducing the number of cycles. That is, the delta modulation having a coarse resolution by a large reference voltage and the delta modulation having a fine resolution by a small reference voltage are combined, and performed, and thereby, the number of cycles needed to the A/D conversion decreases. However, an element value of an element configuring a circuit producing the reference voltage has an error usually, and it is difficult to produce multiple reference voltages having different magnitude with high ratio accuracy. Therefore, when the DAC performs the feedback, the error occurs. It is difficult to provide the A/D conversion with high accuracy. Although the delta modulations having the coarse resolution and the fine resolution are combined and the number of cycles needed to the A/D conversion is decreased, the difficulty that the number of cycles needed to the A/D conversion exponentially increases with making high resolution remains.

According to a general configuration of the delta sigma type A/D convertor as described in Patent Literature 2 and Non-patent Literature 1 and the A/D convertor as described in Patent Literature 3, the sampling capacitance and the integration capacitor of an integrator are configured by different capacitive elements. Therefore, to reduce thermal noise in the sampling, it is necessary to increase the capacity value of the sampling capacitance. In addition, when the capacity value of the sampling capacitance is enlarged in order to reduce the thermal noise, in order to avoid saturation an output signal amplitude of the integrator, it is necessary to increase the capacity value of the integration capacitor of an integrator according to the size of the sampling capacitance, and a large are is needed to the integration capacitor provide on an integrated circuit.

Since transfer of a signal electric charge from the sampling capacitance to the integrator is necessary, in order to reduce influence of the thermal noise or a flicker noise occurring at the time of transfer, it is necessary to reduce the noise by increasing the area or power consumption of the operational amplifier configuring the integrator.

It is an object of the present disclosure to provide a nyquist A/D convertor that enables to implement an A/D conversion with high speed and high accuracy in a simple configuration.

According to one aspect of the present disclosure, an A/D convertor to convert an analog signal into a digital value includes: an integrator that includes an operational amplifier including a first input terminal and an output terminal, and an integration capacitor being inserted between the first input terminal and the output terminal of the operational amplifier; a quantizer that outputs a quantization result of quantizing an output signal of the operational amplifier; and a DAC that is connected with the first input terminal of the operational amplifier and determines based on the quantization result, a DAC voltage to perform a subtraction of an electric charge accumulated in the integration capacitor. The integrator has a feedback switch that turns on and off a connection that connects the integration capacitor and the output terminal of the operational amplifier to each other. The analog signal as input signal is inputted between the integration capacitor and the feedback switch. The integration capacitor samples the analog signal. The quantizer performs a quantization based on an output of the operational amplifier. The DAC sequentially subtracts the electric charge accumulated in the integration capacitor based on the quantization result, and converts the analog signal to a digital value.

According to the configuration, the analog signal as the input signal is held in the integration capacitor of the integrator by one sampling. Since the A/D conversion is performed based in an electric charge held by the sampling, an oversampling is unnecessary. That is, it may be possible to configure the nyquist A/D converter performing the A/D conversion to the input signal at the specific time. Since the oversampling is unnecessary, the operation frequency of the circuit is not limited to the operation frequency of the buffer in the preceding stage. Therefore, it may be possible to provide a high speed A/D conversion.

For example, by configuring the DAC with using one capacitance and by configuring so that the DAC is driven by substantially one reference voltage, it may be possible to suppress the error of the A/D conversion resulting from the characteristic variation of the configuration element. Hence, without an operation to be often performed to improve accuracy such as the trimming, the dithering, or the like, which is performed in the SAR type A/D convertor including the DAC configured of the multiple capacitances used to the A/D conversion, it may be possible to achieve the high accuracy A/D conversion. Since the DAC is not driven by using multiple reference voltages different from Patent Literature 3, the nonlinearity error of the A/D conversion resulting from an error of the circuit generating the reference voltage is not generated.

The sampling is performed by using the integration capacitor. Therefore, in comparison with the delta sigma type A/D convertor as described in Patent Literature 2 or Non-patent Literature 1 and with the A/D convertor configured so that a capacity of the integration capacitor is different from the capacity of the sampling capacitance as described in Patent Literature 3, the transfer of the signal electric charge between the integration capacitor and the sampling capacitance after the sampling is unnecessary. Since a reset of the integration capacitor is unnecessary, the thermal noise resulting from reset of the integration capacitor does not occur. Therefore, it may be possible to provide the A/D conversion with high speed and low noise. The sampling capacitance, which needs a large capacity value and a large area to sufficiently reduce the thermal noise, is unnecessary. Therefore, it may be possible to provide the A/D conversion at a low cost.

In comparison to the SAR type A/D convertor that requires the multiple elements as described in Patent Literature 1 and the A/D convertor using the high-order ΔΣ modulation requiring multiple integrators to obtain high speed as shown in Non-patent Literature 1, it may be possible to provide the A/D convertor with the simple configuration. Therefore, it may be possible to provide a nyquist A/D convertor in a simple configuration and to provide the high speed and high accuracy A/D conversion.

BRIEF DESCRIPTION OF DRAWINGS

The above and other aspects, features and advantages of the present disclosure will become more apparent from the following detailed description made with reference to the accompanying drawings. In the drawings.

DETAILED DESCRIPTION

Hereinafter, embodiments of the present disclosure will be explained with reference to the drawings. In each of the drawings, a part identical or similar to each other will be given with identical numerals.

First Embodiment

First, with reference to FIG. 1, a schematic configuration of an A/D convertor (analog digital convertor) according to an embodiment of the present disclosure will be explained.

Figure 1:
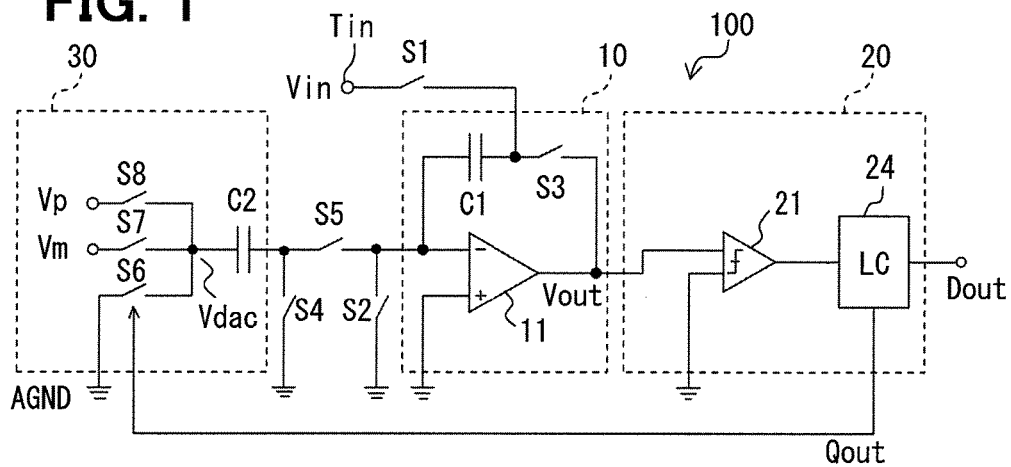
FIG. 1 is a circuit diagram showing a schematic configuration of an A/D converter according to a first embodiment.

As shown in FIG. 1, an A/D convertor 100 includes an integrator 10, a quantizer 20, and a D/A convertor 30 (hereinafter, referred to as a DAC 30). An input signal (Vin) is an analog signal, and a signal (Dout) outputted from the A/D convertor 100 is a digital signal. A D/A convertor is also referred to as a digital-to-analog Converter, and DAC.

The integrator 10 has an operational amplifier 11, an integration capacitor C1 and a feedback switch S3. The integration capacitor C1 is inserted between an inverting input terminal and an output terminal of the operational amplifier 11. The feedback switch S3 is inserted between the integration capacitor C1 and the output terminal of the operational amplifier 11. That is, the integration capacitor C1 and the feedback switch S3 are connected in series with each other, and arranged between the inverting input terminal and the output terminal of the operational amplifier 11. On the other hand, the inverting input terminal of the operational amplifier 11 is connected with an analog ground level (AGND). AGND is a reference potential of the whole A/D converter, and does not necessarily equal to 0V. The first input terminal of the present disclosure corresponds to the inverting input terminal in the present embodiments. The inverting input terminal of the operational amplifier 11 is connectable to AGND through the switch S2.

An input terminal Tin of the A/D convertor 100 is, as shown in FIG. 1, connected between the integration capacitor C1 and the feedback switch S3 through a switch S1. According to the configuration, in a state with the feedback switch S3 turns off, the switch S1 and the switch S2 are turned on, so that the electric charge on the basis of a magnitude of the input signal Vin is accumulated to the integration capacitor C1. In other words, the input signal Vin is sampled by the integration capacitor C1. Hereinafter, a potential of the analog signal inputted may be simply referred to as an input signal Vin or merely a Vin, the potential of the output terminal of the operational amplifier 11 is referred to as an output voltage Vout or simply referred to as a Vout. In the state the switch S1 and the switch S2 are turned off and the feedback switch S3 is turned on, the output voltage Vout of the operational amplifier 11 becomes equal to the potential of one end in a side that the Vin of the integration capacitor C1 is inputted. Hereinafter, the feedback switch S3 may be simply referred to as a switch S3.

The quantizer 20 receives the output of the integrator 10, that is, the output voltage Vout of the operational amplifier 11. The quantizer 20 outputs a Qout being a result of quantization of the output voltage Vout. That is, the quantizer 20 performs the quantization to the output voltage Vout being an analog value and converts it to the quantization result Qout being a digital value. The quantizer 20 outputs a Dout being the A/D conversion result of the input signal Vin. The quantizer 20 has a comparator 21 and a logic circuit 24.

In the comparator 21, the output voltage Vout of the operational amplifier 11 is inputted to a non-inverting input terminal, and AGND is inputted to the inverting terminal. The output of the comparator 21 is inputted to the logic circuit 24. When the logic circuit 24 outputs the quantization result Qout to the DAC 30 based on the output of the comparator 21, and outputs an A/D conversion result Dout. The quantization result of the present disclosure corresponds to the Qout.

When Vout≥AGND is satisfied, the logic circuit 24 outputs 1 as the quantization result Qout. In contrast, when Vout<AGND is satisfied, the logic circuit 24 outputs −1 as the Qout. That is, the quantizer 20 according to the embodiment corresponds to a 1 bit quantizer. Each time that the quantizer 20 performs the quantization in a process of the A/D conversion, the logic circuit 24 sequentially integrates the Qout, and produces an A/D conversion result Dout. More specific operation of the quantizer 20 will be described later.

The DAC 30 corresponds to the D/A convertor and, based on the quantization result Qout outputted by the quantizer 20, determines the amount of the electric charge which the DAC 30 subtracts from the integration capacitor C1. The DAC 30 corresponds to a two-level D/A convertor virtually having a high level voltage Vp set at a potential higher than AGND and a low level voltage Vm set at a potential lower than AGND. The Vp and the Vm are set, so that, when AGND is equal to 0V, absolute values of the Vp and the Vm are same and a relation of the Vp and the Vm becomes reverse in positive and negative each other, and a relation of Vp=−Vm is satisfied.

The DAC 30 has a DAC capacitor C2. The one end of the DAC capacitor C2 is connected with AGND and voltage source generating the reference voltage through switches S6 to S8. In particular, the one end of the DAC capacitor C2 is connected with AGND through the switch S6, with the Vm through a switch S7, and with the Vp through a switch S8. The potential of the one end of the DAC capacitor C2 becomes equal to one of Vp, Vm and AGND, which are exclusively selected by the switches S6-S8. Hereinafter, the potential of the one end of the DAC capacitor C2 is referred to as a DAC voltage Vdac.

In addition, the one end of the inverting input terminal of the operational amplifier 11 in the DAC capacitor C2 is connectable with AGND through the switch S4. The DAC capacitor C2 is connected with the inverting input terminal of the operational amplifier 11 through the switch S5. That is, the DAC 30 is connected with the integrator 10 through the switch S5.

When the switch S5 is turned off and the switch S4 is turned on, the DAC capacitor C2 accumulates the electric charge based on the reference voltage selected by the switch S7 or the switch S8. In addition, in the state that the electric charge is accumulated in the DAC capacitor C2, the switch S4 is turned off and the switch S5 is turned on, so that the DAC capacitor C2 is connected with integrator 10. By turning off the switch S7 and the switch S8 and turning on the switch S6, the electric charge accumulated in the DAC capacitor C2 is transferred to the integration capacitor C1. That is, the DAC 30 performs a subtraction of the electric charge accumulated in the integration capacitor C1.

The present embodiment is configured so that, when the electric charge is accumulated in the DAC capacitor C2, the switch S7 turns on in the case of Qout=1, and the switch S8 turns on in the case of Qout=−1. Though AGND is also connected with the DAC capacitor C2 through the switch S6, according to the embodiment, the electric charge accumulated in the DAC capacitor C2 is determined based on an electric potential difference between Vp−AGND or between Vm−AGND. Therefore, when AGND equals to 0V, the electric charge accumulated in the DAC capacitor C2 is determined by the magnitude of the Vp or Vm, and AGND is not virtually used as the reference voltage of the D/A conversion.

Next, with reference to FIG. 2, the specific operation of the A/D convertor 100 according to the embodiment will be described.

Figure 2:
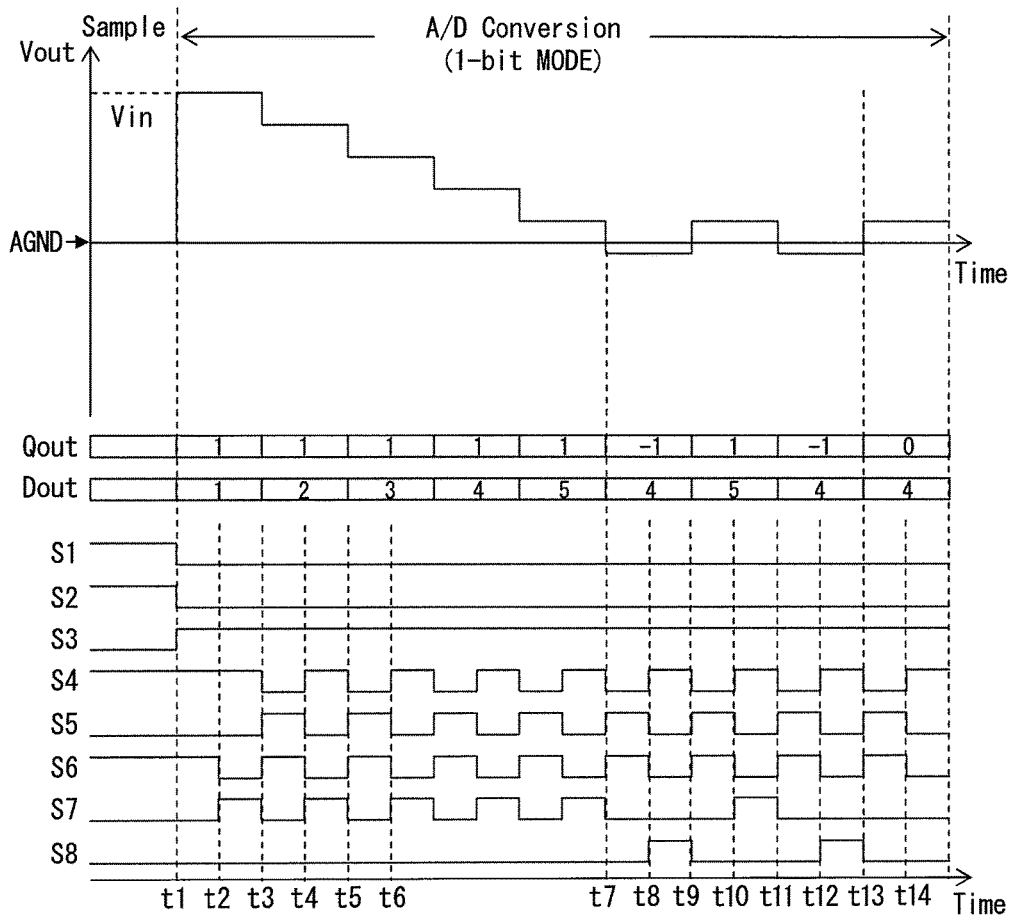
FIG. 2 is a timing chart showing an A/D conversion operation according to the first embodiment.

FIG. 2 shows a timing chart illustrating the operation of the A/D convertor 100. A period at and before a time t1 corresponds to the period of the sampling, and a period at and after the time t1 corresponds to a period of the A/D conversion.

(Sampling)

It is supposed that, in the period of the sampling at and before the time t1, the switch S1, the switch S2, the switch S4 and the switch S6 turn on, and the switch S3, the switch S5, the switch S7, and the switch S8 turn off. Since the switch S5 turns off, the integrator 10 and the DAC 30 is electrically separated each other. Since the switch S3 turns off, the integration capacitor C1 and the output terminal of the operational amplifier 11 is electrically separated each other.

In the period of the sampling, since the switch S1 and the switch S2 are turned on, the integration capacitor C1 is in the state that both of these terminals are respectively connected with the input signal Vin and AGND. Therefore, the electric charge based on the input signal Vin is accumulated in the integration capacitor C1. That is, the input signal Vin is sampled to the integration capacitor C1.

On the other hand, since the switch S4 and the switch S6 are turned on, both of the terminals of the DAC capacitor C2 are connected with AGND. Thereby, the DAC capacitor C2 is in the state that the electric charge is not accumulated, in other words, in a reset state. Since the electric charge based on the value of the quantization result Qout is accumulated in the DAC capacitor C2 at and after the time t1, the operation of the reset is not necessary.

(A/D Conversion)

In the period of the A/D conversion at and after the time t1, the output voltage Vout of the integrator 10 is quantized by the quantizer 20 and the operation that the electric charge based on the quantization result Qout is subtracted from the electric charge accumulated in the integration capacitor C1 by the DAC 30 is repeated, and thereby, the A/D conversion of the input signal Vin is performed.

At the time t1, the switch S1 and the switch S2 turn off, and the switch S3 turns on, so that the output voltage Vout of the operational amplifier 11 equals to a voltage value of the Vin, and the Vin is held in the integration capacitor C1. According to an example as shown in the FIG. 2, from the time t1 to the time t3, the value of the Vout is greater than the value of AGND being a threshold voltage of the comparator 21 configuring the quantizer 20. Therefore, the quantizer 20 outputs Qout=1 and Dout=1. At the time t1 and after, the switch S1 and the switch S2 always turn off, and the switch S3 always turns on.

The DAC 30 receives Qout=1, and at the time t2, the switch S6 is turned off and the switch S7 is turned on. Therefore, in the DAC capacitor C2, the electric charge based on the potential difference between the low level voltage Vm and AGND and on the capacity value of the DAC capacitor C2 is accumulated.

At the time t3, the switch S4 is turned off and the switch S5 is turned on and also the switch S7 is turned off and the switch S6 is turned on. Therefore, the electric charge according to the potential difference of the DAC voltage Vdac (=Vm−AGND) before and after the time t3 and to the capacity value of the DAC capacitor C2 is transferred from the DAC capacitor C2 to the integration capacitor C1. The voltage corresponding to a residual difference of the A/D conversion is outputted as the output voltage Vout of the operational amplifier 11. The operation from the time t2 to the time t4 is 1 cycle according to a first subtraction of the electric charge from the integration capacitor C1. Hereinafter, the 1 cycle according to a subtraction as same as the subtraction from the time t2 to the time t4 may be referred to as a subtraction cycle.

The DAC 30 performs a first subtraction from an initial Vout from the time t1 to the time t3, the initial Vout corresponding to the result of the sampling of the input signal Vin, so that the residual of the A/D conversion is generated. In the time t3 to a time t5, the operational amplifier 11 outputs the residual of the A/D conversion as Vout. The residual is inputted to the quantizer 20 and is quantized. As shown in FIG. 2, the value of the residual from the time t3 to the time t5 is greater than the value of AGND. Therefore, in the similar way as from the time t1 to the time t3, the quantizer 20 outputs Qout=1. The quantizer 20 outputs Dout=2 being an integrated value of the result of a first quantization (Qout=1 from the time t1 to the time t3) and the result of a second quantization (Qout=1 from the time t3 to the time t5). In order to simplify, FIG. 2 describes that, at the time t3, the Vout, the Qout and the Dout immediately change and become stabilized. In an actual operation, the operation of the integrator, the switch, the quantizer or the like are delayed, and therefore, before the Vout starts to change at the time t3 and become stabilized, and the quantization result is determined, it takes a certain amount of time. Each of the operation from the time t1 to the time t3 and the operation from the time t3 to the time t5 are the 1 cycle related to the quantization by the quantizer 20. Hereinafter, the 1 cycle related to the similar quantization may be referred to as a quantization cycle.

A second quantization result from the time t3 to the time t5 is Qout=1 as well as the first quantization result from the time t1 to the time t3. Therefore, in a second subtraction cycle from the time t4 to a time t6 shown in FIG. 2, the subtraction is performed with the operation as similar to the operation of the first subtraction cycle from the time t2 to the time t4. In the period from the time t1 to a time t7, the relation of Vout AGND is satisfied, so that the relation Qout=1 is satisfied, and the Dout is added by 1 each 1 quantization cycle. In the period from the time t1 to the time t7, 5 cycles of the quantization cycle of the Qout=1 exists, so that Dout=5 is satisfied immediately before the time t7.

At the time t7, when a fifth subtraction is performed, the Vout becomes less than AGND. Therefore, from the time t7 to a time t9, the quantizer 20 outputs Qout=−1. The Qout changes from 1 at and before the time t7 to −1. Thereby, in the subtraction cycle from a time t8 to a time t10, the operation of the switch S7 and the switch S8 are different from the operation of the subtraction cycle at and before the time t8. Specifically, at the time t8, the switch S6 is turned off and the switch S8 is turned on. In addition, at the time t9, the switch S8 is turned off and, the switch S6 is turned on. In the period from the time t8 to the time t9, the switch S7 remains in an off state. Therefore, the electric charge corresponding to the difference potential of the DAC voltage Vdac (=Vp−AGND) and the capacity value of the DAC capacitor C2 before and after the time t9 is transferred to the integration capacitor C1, and the Vout increases.

In the period from the time t9 to a time t11, the relation Vout≥AGND is satisfied again, so that the Qout becomes equal to 1 and the Dout becomes equal to 5. Since the quantization result from the time t9 to the time t11 is Qout=1. Thus, at the time t11, the Vout decreases again at the time t11 and the relation Vout<AGND is satisfied. Therefore, in the period from the time t11 to a time t13, Qout=−1 is outputted and Dout becomes equal to 4.

Eight cycles of the quantization and 7 cycles of the subtraction are performed by the time t13. Thereby, the resolution of the A/D conversion of the 3 bits (9 gradations) is obtained. Though the A/D conversion may complete at the time t13, according to the embodiment, 1 cycle of the subtraction and 1 cycle of the quantization are further performed, so that the resolution of the A/D conversion becomes 4 bits (16 gradations).

In particular, as shown FIG. 2, the quantization result Qout from the time t11 to the time t13 is equal to −1. Thus, within the operation of the DAC 30 from a time t12 to a time t14 as similar to the operation from the time t8 to the time t10, the electric charge is transferred from the DAC capacitor C2 to the integration capacitor C1, and the Vout increases. That is, an eighth subtraction being a last subtraction is performed.

After the time t13, a ninth quantization being a last quantization is performed. According to the last quantization, the quantizer 20 is configured so that, the quantizer 20 outputs Qout=0 in a case of Vout≥AGND, and the quantizer 20 outputs Qout=−1 in a case of Vout<AGND is satisfied. An example as shown in FIG. 2, since the relation Vout≥AGND is satisfied, Qout=0 and Dout=4. The value of the Dout is a final A/D conversion result of the input signal Vin.

According to the A/D convertor of the present disclosure, the subtraction of the electric charge from the integration capacitor C1 and the quantization by the quantizer 20 are performed predetermined cycles so that a desired resolution is obtained without depending on the level of the input signal Vin. According to the embodiment, when the desired resolution of the A/D convertor 100 is N bits, the subtraction of the electric charge needs 2N−1 cycle and the quantization needs 2N−1+1 cycle.

Next, the effect of the A/D convertor 100 according to the present embodiment will be described.

The A/D convertor 100 is configured so that, at the time of the sampling, the integration capacitor C1 is disconnected from the output terminal of the operational amplifier 11 and the input signal Vin can be inputted to the integration capacitor C1. Therefore, the reset of the integration capacitor C1 is unnecessary. In addition, it may be possible to omit a transfer of a signal electric charge from the sampling capacitance to the integration capacitor, the transfer is required in a general delta sigma type A/D converter or the A/D converter described in Patent Literature 3. According to the conventional configuration, in the reset of the integration capacitor, the sampling by a sampling capacitor, and the transfer of the signal electric charge from the sampling capacitor to the integration capacitor, effects of the thermal noise and flicker noise are accumulated. By contrast, according to the embodiment, the reset of the integration capacitor C1 and the transfer of the signal electric charge from the sampling capacitance to the integration capacitor are unnecessary. Therefore, in comparison to the configuration performing the transfer of the signal electric charge from the sampling capacitance to the integration capacitor, it may be possible to reduce the effect of the thermal noise and the flicker noise.

In comparison to the general delta sigma type A/D convertor or the A/D convertor described in Patent Literature 3, according to the embodiment, the transfer of the signal electric charge from the sampling capacitance to the integration capacitor is unnecessary. Furthermore, since decrease of a feedback factor of the operational amplifier 11 due to connection of the sampling capacitance to the integrator does not occur, it may be possible to ease a requirement specification of a slew rate, a band width 1, an on-resistance, or the like to the operational amplifier 11 or various switches. It may be possible to reduce the power consumption and the area of the operational amplifier and a switch, or to speed up the A/D conversion.

In a configuration having an integration capacitor and a sampling capacitance as conventional, when an amplitude of an input signal is substantially equal to an amplitude of an output signal of an integrator, it is necessary that the capacity value of the integration capacitor is substantially equal to that of the sampling capacitance in order to avoid saturation of the output signal of the integrator. According to the embodiment, the sampling of the input signal is performed by using the integration capacitor C1. Therefore, the sampling capacitance is unnecessary and it may be possible to decrease to approximately half the area of the capacity element requiring a relatively large area when provided as the semiconductor integrated circuit.

The A/D convertor 100 is the nyquist A/D convertor performing a one time of the A/D conversion for each sampling. Therefore, a high speed buffer, which is often required as a prior step in the general delta sigma type A/D convertor requiring the oversampling, is unnecessary. Hence, with less limitation on a conversion frequency resulting from speed of the sampling, it may possible to provide the high speed and high accuracy A/D conversion.

The subtraction of the electric charge accumulated in the integration capacitor C1 is performed based on one DAC capacitor C2 and substantially one potential difference (Vp−Vm). Therefore, the nonlinearity error of the A/D conversion resulting from variation of elements and an error of the voltage value of a power source generating the reference voltage does not occur. Hence, in comparison to the configuration using multiple reference voltages in order to drive the DAC as shown in Patent Literature 3 or the configuration that the DAC is configured by multiple capacitances as seen in general SAR type A/D convertor and the delta sigma type of multi bits, it may be possible to reduce the nonlinearity error of the A/D conversion. Hence, it may be possible to provide the high accuracy A/D convertor without performing a dithering, a trimming or the like used to improve accuracy in the SAR type A/D convertor.

In comparison to the SAR type A/D convertor using the multiple elements or a high-order delta sigma type A/D convertor using the multiple integrators, it may be possible to achieve the A/D conversion with a simple configuration.

In addition, according to the embodiment, the subtraction of the electric charge by the predetermined number of cycles corresponding to the resolution of the desired A/D conversion is performed without depending on the level of the input signal Vin. That is, even when the output voltage Vout of the operational amplifier 11 exceeds, by the subtraction, from a side greater than AGND to a side smaller than AGND, or from the side smaller than AGND to the side greater than AGND, the subtraction continues by reaching the predetermined number of cycles. As shown in Patent Literature 3, in a configuration that the number of times of calculation of the operational amplifier are different depending on the input signal, the size of the error of the A/D conversion resulting from the offset of the operational amplifier or the like depends on the level of the input signal. Therefore, the nonlinear error may be generated in the A/D conversion. By contrast, according to the A/D convertor 100, the subtraction is performed in the identical times by a same time without depending on an input level. Therefore, there is no input level dependence of the error of the A/D conversion resulting from the offset of the operational amplifier 11 or the like. That is, it may be possible to provide the high accuracy A/D conversion with less nonlinear error.

(First Modification)

When the DAC 30 of the 2 levels as described in the first embodiment is employed, in addition to a method subtracting the electric charge using the potential difference within Vp−AGND or the potential difference within Vm−AGND as the first embodiment, it may be possible to adopt a method subtracting the electric charge using the potential difference within Vp−Vm.

Figure 3:
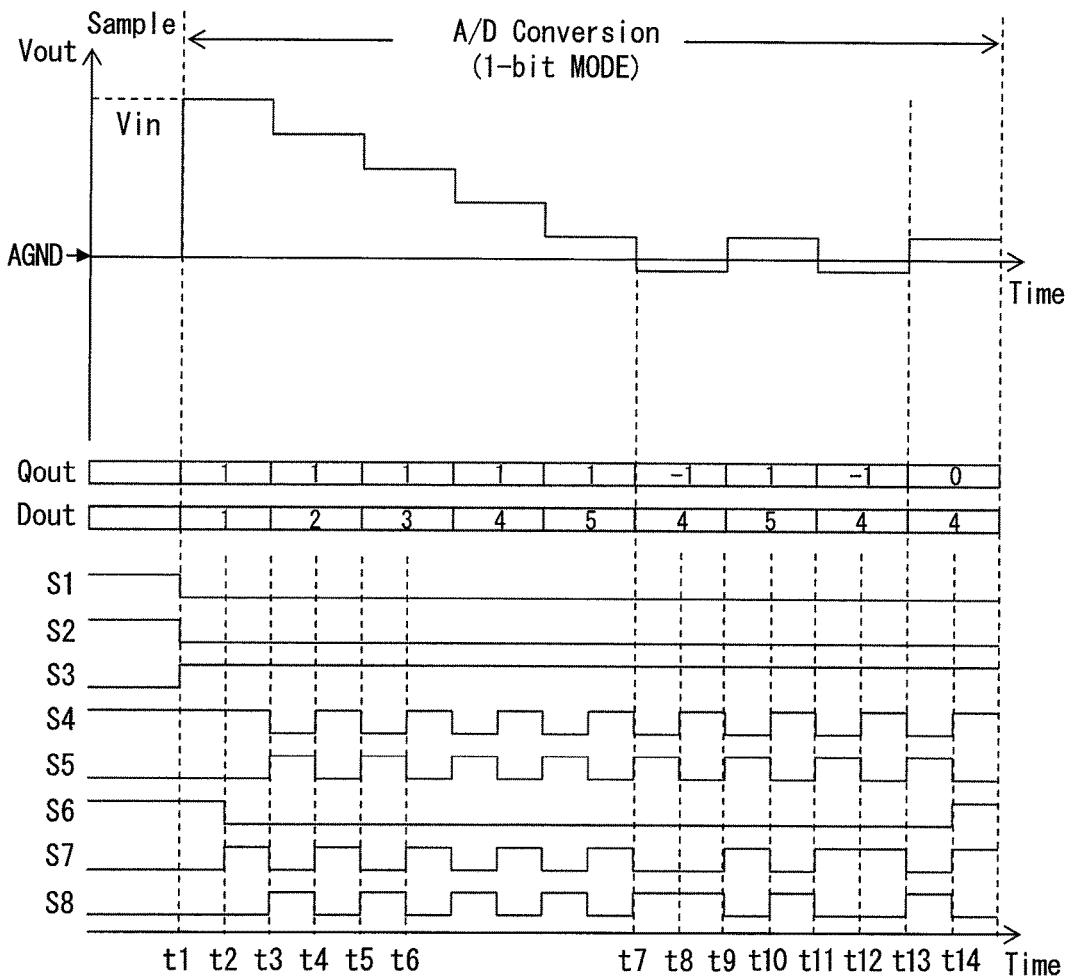
FIG. 3 is a timing chart showing an A/D conversion operation by the A/D converter according to a first modification.

As shown in FIG. 3, the A/D convertor 100 according to the present modification changes the operation of the switches S6 to S8 to the first embodiment. In particular, within the time t2 to the time t14 including the period of the subtraction cycle, the switch S6 remains in an off state. Then, according to the output Qout of the quantizer 20, either the switch S7 or the switch S8 is exclusively tuned on in the first half of the subtraction cycle. In the second half of the subtraction cycle, the on or off of the switch S7 and the switch S8 are controlled so as to be inverted with respect to the first half of the subtraction cycle. Therefore, the electric charge is transferred from the DAC capacitor C2 to the integration capacitor C. According to the output Qout of the quantizer 20, the amount of the electric charge is determined by the capacity value of the DAC capacitor C2 and the potential difference between the first half and the second half of the subtraction of the DAC voltage Vdac(=Vp−Vm or Vm−Vp), and so the voltage that corresponds to the residual of the A/D conversion is outputted as the output voltage Vout.

Within the subtraction cycle from the time t2 to the time t4, the Qout used in a control of the DAC 30 is Qout=1, which is outputted in the quantization cycle from the time t1 to t3. That is, within the subtraction cycle corresponding to the quantization cycle, a time gap by a half of the cycle exists. Therefore, so that, from the time t2 to the time t4, the DAC 30 is controlled based on Qout=1 outputted in the period from the time t1 to the time t3, the delay may be inserted between the output Qout of the quantizer 20 and the control of the DAC 30 appropriately. In the other way, timing with the output Qout of quantizer 20 changing may be configured to be delayed in a half quantization cycle to FIG. 3.

The absolute value of the potential difference between the first half and the second half of the DAC voltage Vdac(=Vp−Vm or Vm−Vp) according to the modification corresponds to the double of the absolute value of the potential difference according to the first embodiment (=Vp−AGND or Vm−AGND). Therefore, when the subtraction similar to the first embodiment is performed, it may be possible to reduce to half the capacity value of the DAC capacitor C2. Hence, it may be possible to reduce the effect of the thermal noise generated by the subtraction of the DAC capacitor C2 and the flicker noise of the operational amplifier 11 on the A/D conversion result.

The DAC 30 according to the modification, in comparison to the first embodiment, the switch S6 remains in the off state from the time t2 to the time t14. Therefore, AGND is not used in the subtraction accompanying a change of the Vout by the DAC 30. Hence, in the case that the modification is provided in a circuit configuration of a single end, when the error occurs between the middle potential within the Vp and the Vm and the potential of AGND, an offset error of the A/D conversion resulting from the subtraction of the electric charge from the integration capacitor C1 does not occur. That is, it may be possible to ease the requirement to the accuracy of the electric source generating the Vp, Vm and AGND in comparison to the first embodiment.

Second Embodiment

In reference to FIG. 4, a schematic configuration of an A/D convertor relate to an embodiment will be described.

Figure 4:
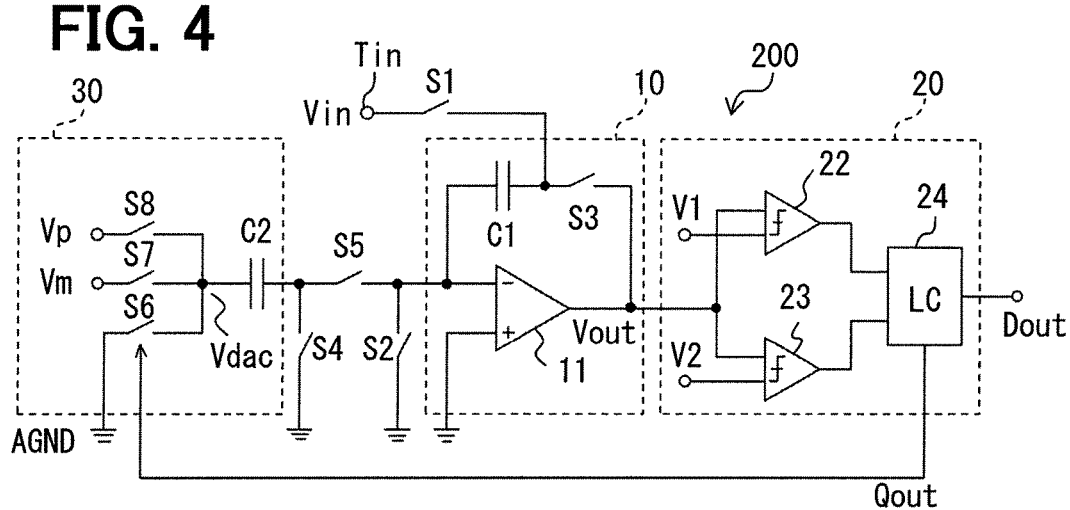
FIG. 4 is a circuit diagram showing a schematic configuration of an A/D converter according to a second embodiment.

As shown in FIG. 4, an A/D convertor 200 includes an integrator 10, a quantizer 20 and a D/A convertor 30 (hereinafter referred to as a DAC 30). An input signal (Vin) corresponds to analog signal. A signal (Dout) outputted from the A/D convertor 200 corresponds to digital signal.

In the A/D convertor 200 according to the embodiment, the configuration of the quantizer 20 is different in comparison to the A/D convertor 100 in the first embodiment. The configuration of the integrator 10 is similar to the configuration of the first embodiment. Therefore, the detailed explanation will be omitted. In the DAC 30, the specifications of the input signal, that is, the DAC voltage Vdac corresponding to the output voltage Qout of the quantizer 20 is different from the first embodiment. As following, it will be described specifically.

According to the quantizer 20 of the embodiment, the output of the integrator 10, in other words, the output voltage Vout of the operational amplifier 11 is inputted and the Qout being the result of the quantization of the Vout is outputted. That is, the quantizer 20 quantizes the Vout being the analog value, and changes it to the quantization result Qout being the digital value. In addition, the quantizer 20 outputs the Dout being the A/D conversion result of the input signal Vin. The quantizer 20 has a first comparator 22, a second comparator 23 and the logic circuit 24.

In regard to the first comparator 22, the output voltage Vout of the operational amplifier 11 is inputted to the non-inverting input terminal, and the threshold voltage V1 is inputted to the inverting input terminal. In regard to the second comparator 23, similar to the first comparator 22, the output voltage Vout of the operational amplifier 11 is inputted to the non-inverting input terminal and a threshold voltage V2 is inputted to the inverting input terminal. The threshold voltage V1 has potential higher than AGND, and the threshold voltage V2 has potential lower than AGND. That is, each voltage has the relation V2<AGND<V1 is satisfied. The outputs of the comparators 22, 23 are inputted to the logic circuit 24. Based on outputs of the comparators 22, 23, the logic circuit 24 outputs the quantization result Qout to the DAC 30 and outputs the digital signal Dout as the A/D conversion result.

When the relation Vout>V1 is satisfied, the logic circuit 24 outputs 1 as the quantization result Qout. In contrast, when V2≤Vout≤V1 is satisfied, the logic circuit 24 outputs 0 as the Qout. When Vout<V2 is satisfied, the logic circuit 24 outputs −1 as the Qout. That is, the quantizer 20 according to the embodiment corresponds to a 1.5 bit quantizer. Each time the quantizer 20 performs the quantization in a process of the A/D conversion, the logic circuit 24 sequentially integrates the Qout, and produces an A/D conversion result Dout. More specific operation of the quantizer 20 will be described later.

The DAC 30 corresponds to the D/A convertor and, based on the quantization result Qout outputted by the quantizer 20, determines the amount of the electric charge that DAC 30 subtracts from the integration capacitor C1. The DAC 30 corresponds to 3 levels D/A convertor having, as the reference voltage, the analog ground level AGND, a high level voltage Vp set at potential higher than AGND and a low level voltage Vm set at potential lower than AGND.

In the present embodiment, when the electric charge is accumulated in the DAC capacitor C2, the switch S7 is turned on in the case of Qout=1, the switch S8 is turned on in the case of Qout=−1, and the switch S6 is turned on in the case of Qout=0. For example, when AGND=0V is satisfied, the Vp and the Vm may be set to satisfy Vp=−Vm. The threshold voltages V1, V2 inputted to the comparator 21 and 22, for example, are set that V1=Vp/16 and V2=Vm/16.

Next, with reference to FIG. 5, the specific operation of the A/D convertor 200 according to the embodiment will be described.

Figure 5:
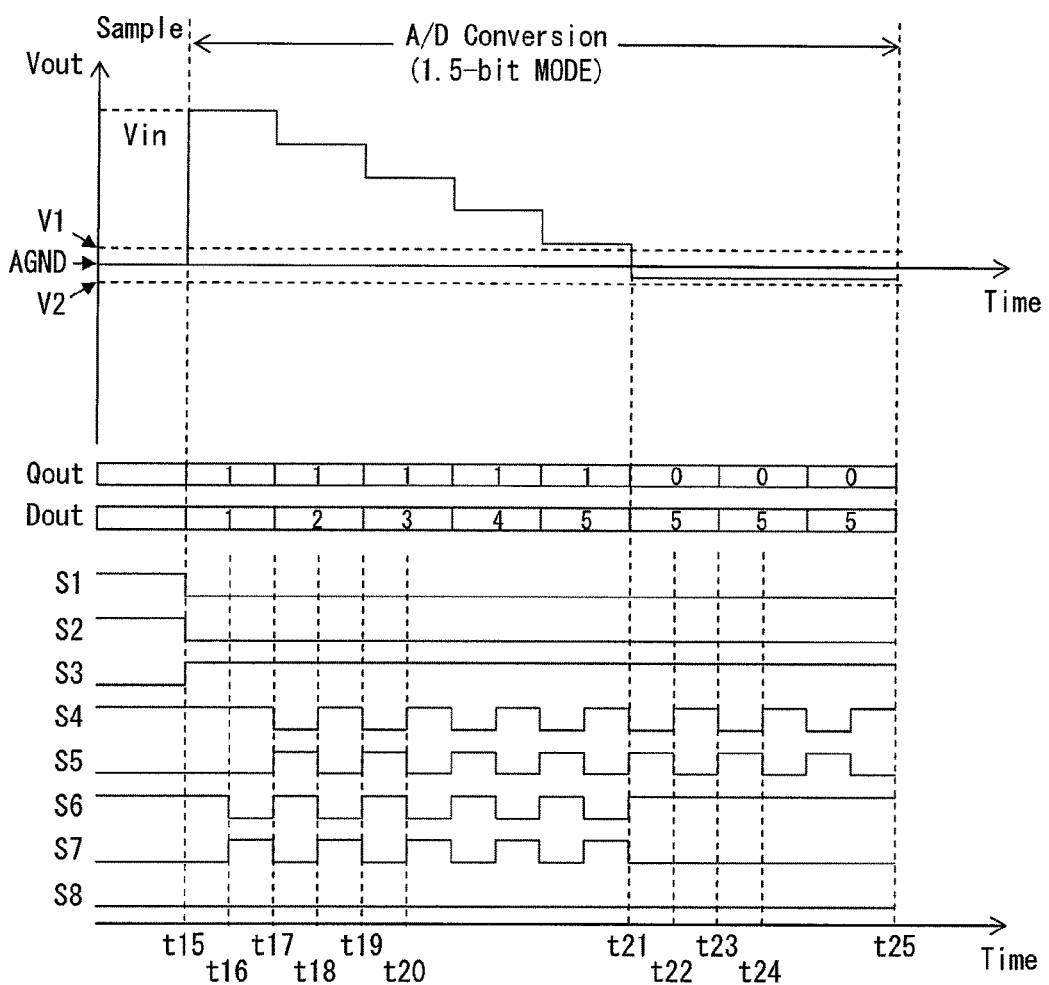
FIG. 5 is a timing chart showing an A/D conversion operation according to the second embodiment.

FIG. 5 is a timing chart showing the operation of the A/D convertor 200. The period at and before a time t15 corresponds to the period of the sampling. The period at and after the time t15 corresponds to the period of the A/D conversion.

(Sampling)

In the period of the sampling at and before the time t15, the switch S1, the switch S2, the switch S4 and the switch S6 are turned on, and the switch S3, the switch S5, the switch S7, and the switch S8 are turned off. Since the switch S5 is turned off, the integrator 10 and the DAC 30 is electrically separated from each other. Since the switch S3 is turned off, the integration capacitor C1 and the output terminal of the operational amplifier 11 is electrically separated each other.

In the period of the sampling, since the switch S1 and the switch S2 are turned on, the input signal Vin is sampled to the integration capacitor C1. The switch S4 and the switch S6 are turned on. Therefore, both of the terminals of the DAC capacitor C2 are connected with AGND and the DAC capacitor C2 is in a reset state.

(A/D Conversion)

In the period of the A/D conversion at and after the time t15, the quantizer 20 quantizes the output voltage Vout of the integrator 10. The DAC 30 repeatedly subtracts the electric charge based on the quantization result Qout from the electric charge accumulated in the integration capacitor C1. Thereby, the A/D conversion of the input signal Vin is performed.

At the time t15, the switch S1 and the switch S2 are turned off and the switch S3 is turned on, so that the output voltage Vout of the operational amplifier 11 becomes equal to the voltage value of the Vin, and the Vin is held in the integration capacitor C1. According to an example as shown in the FIG. 5, from the time t15 to a time t17, the value of the Vout is greater than the value of the threshold voltage V1 of the first comparator 22 configuring the quantizer 20. Therefore, the quantizer 20 outputs Qout=1 and Dout=1.

When Qout=1 is inputted in the DAC 30, the switch S6 is turned off and the switch S7 is turned on at a time t16. Therefore, in the DAC capacitor C2, the electric charge based on the potential difference between the low level voltage Vm and AGND and on the capacity value of the DAC capacitor C2 is accumulated.

At the time t17, the switch S4 is turned off and the switch S5 is turned on and also the switch S7 is turned off and the switch S6 is turned on. Therefore, the electric charge according to the potential difference of the DAC voltage Vdac (=Vm−AGND) before and after the time t17 and to the capacity value of the DAC capacitor C2 is transferred from the DAC capacitor C2 to the integration capacitor C1. The voltage corresponding to the residual of the A/D conversion is outputted as the output voltage Vout of the operational amplifier 11.

In the period from the time t15 to the time t17, the DAC 30 performs the first subtraction from an initial Vout corresponding to the result of the sampling of the input signal Vin. Thereby, the residual of the A/D conversion is produced. In the period from the time t17 to a time t19, the operational amplifier 11 outputs the residual of the A/D conversion as Vout. The residual is inputted to the quantizer 20 and is quantized. As shown in FIG. 5, the value of the residual from the time t17 to the time t19 is greater than the threshold voltage V1. Therefore, in the similar way from the time t15 to the time t17, the quantizer 20 outputs Qout=1. The quantizer 20 outputs Dout=2 being an integrated value of the result of a first quantization (Qout=1 from the time t16 to a time t18) and the result of a second quantization (Qout=1 from the time t18 to a time t20).

In the period from the time t15 to a time t21, the relation Vout>V1 is satisfied, so that Qout is equal to 1 and the Dout is added by 1 each 1 quantization cycle. In the period from the time t15 to the time t21, 5 cycles of the quantization cycle of the Qout=1 exist, so that Dout=5 is immediately before the time t21.

At the time t21, after the fifth subtraction is performed, the V2<Vout<V1 is satisfied. Therefore, from the time t21 to a time t23, the quantizer 20 outputs Qout=0. In the period from a time t22 to a time t24 corresponding to a sixth subtraction cycle, the switch S6 remains in the on state and, the switch S7 and the switch S8 remain in the off state. Thereby, the DAC voltage Vdac continues to equal to the same potential of AGND. The on or off state of the switch S4 and the switch S5 continue as similar to the time t21 and before, so that the subtraction of the electric charge from the integration capacitor C1 by the DAC capacitor C2 continues. The DAC voltage Vdac is maintained in the same potential as AGND, and therefore the subtraction of the electric charge from the integration capacitor C1 is not substantially performed. Therefore, the Vout is unchanged at and after the time t21.

By a time t25, the quantization in 8 cycles and the subtraction in 7 cycles are completed, and the resolution of the A/D conversion of 4 bits (17 gradations) is obtained. According to the example of FIG. 5, Dout=5 obtained by the time t25 becomes a final A/D conversion result of the input signal Vin. According to the embodiment when the desired resolution of the A/D conversion is a N bit, the subtraction of the electric charge needs 2N−1−1 cycles and the quantization of the electric charge needs 2N−1 cycles.

The A/D convertor 200 according to the embodiment has effect similar to the first embodiment. In addition, the quantization cycle corresponding to the last quantization cycle shown in FIG. 2 in the first embodiment is unnecessary since the quantizer 20 according to the embodiment functions as 1.5 bits quantizer. Furthermore, it may be possible to provide the A/D conversion of the resolution of 4 bits (17 gradations) by the quantization of the 8 cycles.

(Second Modification)

When the DAC 30 of 3 levels as described in the second embodiment is adopted, in the period of the A/D conversion, in addition to a method of the subtraction by using the potential difference within Vp−AGND or Vm−AGND as similar to the second embodiment, it may be possible to adopt the method of the subtraction by using the potential difference within Vp−Vm or Vm−Vp as similar to the first modification.

Figure 6:
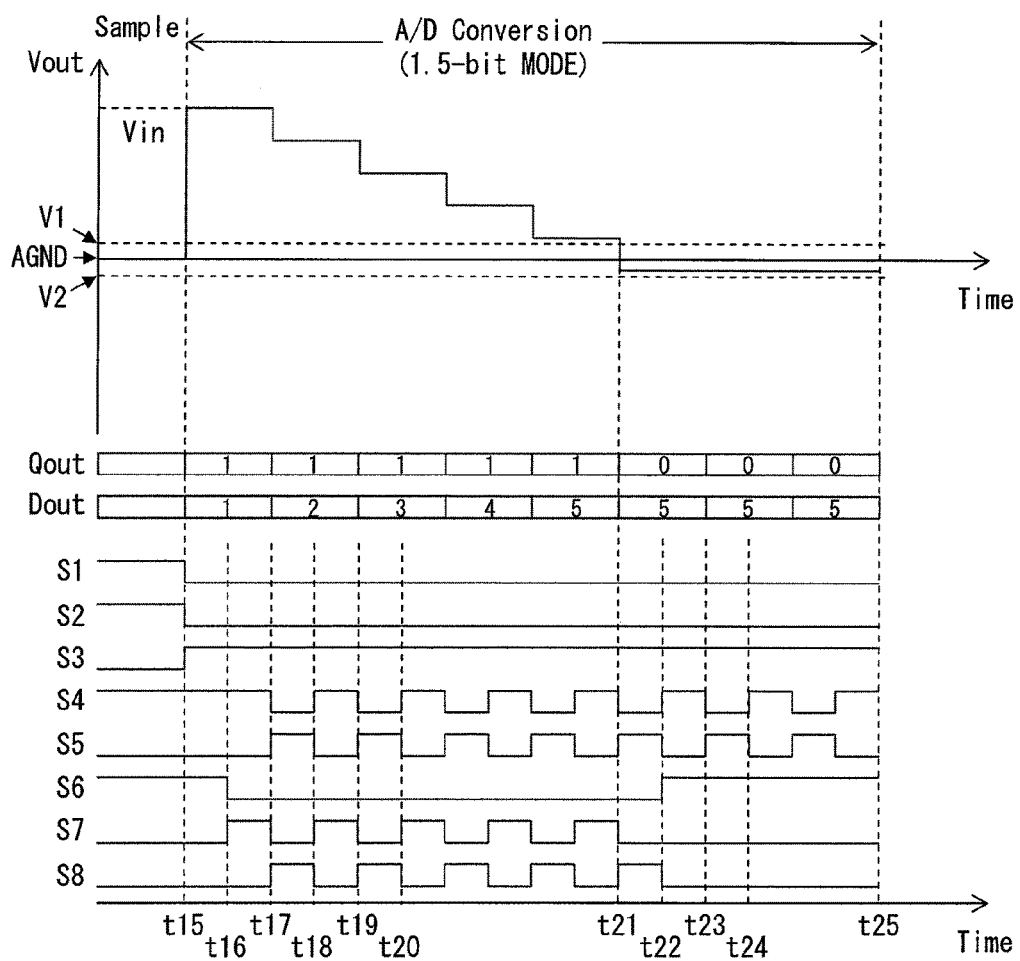
FIG. 6 is a timing chart showing an A/D conversion operation in the A/D converter according to a second modification.

According to the A/D convertor 200 of the present modification, as shown in FIG. 6, the operations of the switches S6 to S8 are changed for the second embodiment. In particular, at the time t16, when the switch S6 is turned off, and the switch S7 is turned on. At the time t17, when the switch S7 is turned off, the switch S6 remains in the off state and the switch S8 is turned on. Thereby, the electric charge according to the potential difference of the DAC voltage Vdac (=Vp−Vm) before and after the time t17 and the capacity value of the DAC capacitor C2 is transferred from the DAC capacitor C2 to the integration capacitor C1. Thereby, the voltage corresponding to the residual of the A/D conversion is outputted as the output voltage Vout of the operational amplifier 11.

According to the embodiment similar to the first modification of the first embodiment, in the subtraction cycle from the time t16 to the time t18, the Qout to use the DAC 30 is Qout=1 outputted to the quantization cycle from the time t15 to the time t17. Therefore, the timing of the control of the DAC 30 accordingly may be adjusted by the method that the delay is inserted between the Qout of the quantizer 20 and the control of the DAC 30, or the like.

Similar to a relation between the first embodiment and the first modification, the absolute value of the potential difference between the first half of and the second half of the 1 subtraction cycle of the DAC voltage Vdac of the first embodiment (=Vp−Vm or Vm−Vp) corresponds to the twice of the absolute value of the potential difference according to the second embodiment (=Vp−AGND or Vm−AGND). Therefore, similar to the first modification of the first embodiment, it may be possible to reduce the effect of the thermal noise or flicker noise to the A/D conversion result.

In the DAC 30 according to the modification, in comparison to the second embodiment, in the period from the time t16 to the time t22, the switch S6 remains in the off state. Therefore, AGND is not used to the subtraction with the change of the Vout by the DAC 30. After the time t22, though AGND is connected to the DAC capacitor C2 through the switch S6, the subtraction is not actually performed. Therefore, in the case that the modification is provided by the circuit configuration of the single end, when the error occurs between the middle potential between the Vp and the Vm and the potential of AGND occurs, the offset error or the nonlinear error of the A/D conversion resulting from the error at the time of the subtraction of the electric charge form the integration capacitor C1. That is, in comparison to the second embodiment, it may be possible to ease the requirement of the accuracy of the electric source generating the Vp, the Vm and AGND.

(Third Modification)

According to the second embodiment and the second modification, it has been described that the embodiment to provide the quantization of 1.5 bit by configuring the quantizer 20 by the two comparators 22, 23. By contrast, according to the present modification, the threshold voltages of the comparators 22, 23 are changeable, and the resolution of the quantizer changes to 1 bit and 1.5 bit. The operation of the embodiment will be described.

Figure 7:
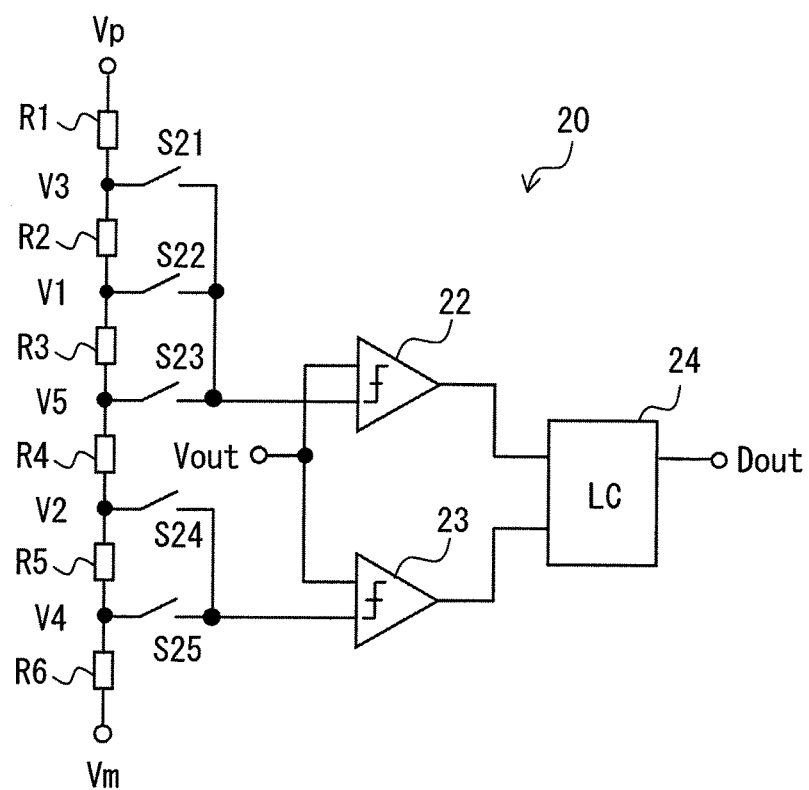
FIG. 7 is a circuit diagram showing a configuration of quantizer according to a third modification.

With reference to FIG. 7, the configuration of the quantizer 20 according to the modification will be described.

In the quantizer 20 as shown in FIG. 7, it is configured that the threshold voltage inputted to the first comparator 22 can be changed in three ways including the V1, the V3 and the V5. In addition, it is configured that the threshold voltage inputted to the second comparator 23 can be changed in two ways including the V2 and the V4. In particular, as shown in FIG. 7, between the high level voltage Vp and the low level voltage Vm, resistors R1 to R6 are connected in series in an order of R1 to R6 in a descending order of potential, and it is configured that the middle potential of each resistor can be inputted to the comparators 22, 23 as the threshold voltage.

That is, each of the resistors R1 to R6 is set so that the voltage V3 occurs in the middle between the resistor R1 and the resistor R2, the voltage V1 occurs in the middle between the resistor R2 and the resistor R3, the voltage V5 occurs in the middle between the resistor R3 and the resistor R4, the voltage V2 occurs in the middle between the resistor R4 and the resistor R5, and the voltage V4 occurs in the middle between the resistor R5 and the resistor R6.

It is configured that, to the inverting input terminal of the first comparator 22, the voltage V3 can be inputted though the switch S21, the voltage V1 can be inputted through the switch S22 and the voltage V5 can be inputted through the switch S23. On the other hand, it is set that, to the inverting input terminal of the second comparator 23, the voltage V2 can be inputted though the switch S24 and the voltage V4 can be inputted through the switch S25.

In the quantizer 20 according to the modification, though 5 kinds of the threshold voltages of the comparators 22, 23 can be set including the V1 to the V5, the operation of the embodiment includes the configuration using only 3 kinds. The example to set the voltage of 5 kinds will be described later in a fourth modification and a fifth modification. It may be preferable that the voltage V5 of the threshold voltages is potential of just middle between the Vp and the Vm. That is, when AGND equals to 0V, it may be preferable that the relation of the voltage is V5=AGND=0V.

Next, with reference to FIG. 8, the operation and a function effect of the A/D convertor 200 relate to the present modification will be described. Though the operation by the time t25 is similar to the operation of the second embodiment, a point that the subtraction based on the Qout immediately before the time t25 is performed is different. That is, when the resolution of the A/D conversion is N bit in the period by the time t25, the point that the subtraction is performed by 2N−1 cycle is different. The other points are similar to the operation. Therefore, the explanation is omitted. The threshold voltages V1, V2 inputted to the comparators 22, 23 are V1=Vp/16 and V2=Vm/16, similar to the second embodiment.

Before the time t25, the threshold voltages of the quantizer 20 are set to the V1 and the V2. That is, the switch S22 and the switch S24 turn on and the switches S21, S23, S25 turn off. Thereby, the quantizer 20 according to modification functions as the 1.5 bit quantizer of before the time t25. In FIG. 8, the period of the A/D conversion is described as 1.5-bit MODE.

At and after the time t25, the switch S22 in the quantizer 20 as shown in FIG. 7 turns off and the switch S23 turns on. Thereby, the threshold voltage inputted to the first comparator 22 becomes the V5(=AGND). At and after the time t25, though the threshold voltage inputted in the second comparator 23 remains to be the V2, the logic circuit 24 according to the present modification is set to ignore the comparison result of the Vout and the V2. That is, after the time t25, the quantizer 20 according to the modification functions as the 1 bit quantizer using only the first comparator 22, the threshold voltage of which is set to be AGND. When the Vout is greater than AGND, the logic circuit 24 outputs Qout=0. When the Vout is lower than AGND, the logic circuit 24 outputs Qout=−1. In FIG. 8, the period of the A/D conversion is described as 1-bit MODE (1 bit mode).

Figure 8:
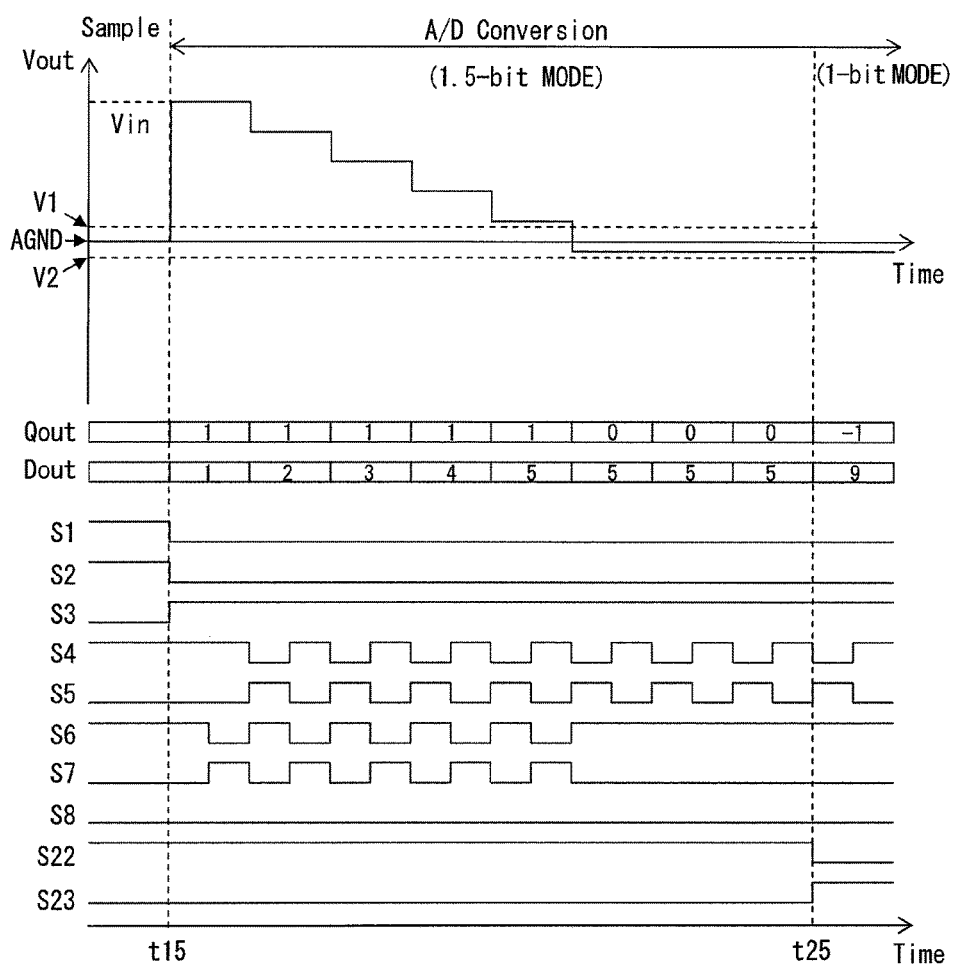
FIG. 8 is a timing chart showing an A/D conversion operation in the A/D converter according to the third modification.

As shown in FIG. 8, at and after the time t25, the Vout inputted to the quantizer 20 is lower than AGND. Therefore, the quantizer 20 outputs the Qout=−1. Then, the logic circuit 24 doubles the digital output Dout obtained by 8 times of the quantization in the 1.5 bit mode immediately before the time t25, and adds Qout=−1 at and after the time t25. Thereby, the final A/D conversion result of the input signal Vin obtained at the time that one last time of the quantization in the 1 bit mode is performed becomes Dout=9.

According to the embodiment, the quantizer 20, the resolution of which is set to 1 bit, performs the last quantization. The threshold voltage V5, which is one of the threshold voltages used to the last quantization, is positioned in the just middle between two threshold voltages V1, V2 used to the quantization at and before the time t25. Therefore, it may be possible to raise the resolution of the A/D conversion in 1 bit by the last quantization. Therefore, the logic circuit 24 calculates and doubles the Dout immediate before the time t25, and adds it to the quantization result Qout of 1 bit.

In the example of FIG. 8, the A/D conversion with the resolution of 5 bits (32 gradations) is performed by the quantization of 9 cycles and the subtraction of 8 cycles. According to the present embodiment, when the intended resolution of the A/D conversion is N bit, the subtraction needs 2N−2 cycles and the quantization needs 2N−2+1 cycles. Therefore, necessary cycles to obtain the resolution corresponding to the second modification become half substantially. By reducing the number of the subtraction cycle, it may be possible to reduce the effect of the thermal noise generated by the subtraction and the flicker noise to the A/D conversion result.

(Fourth Modification)

According to the third modification, in regard to the quantizer 20 in FIG. 7, the embodiment that the resolution is changeable by using 3 kinds of the threshold voltages and the resolution of the A/D conversion is improved has been described. According to the present modification, in regard to the quantizer 20 as shown in FIG. 7, the embodiment that the resolution of the quantizer 20 is changeable by using 5 kinds of the threshold voltages and the resolution of the A/D conversion is further improved will be described.

Figure 9:
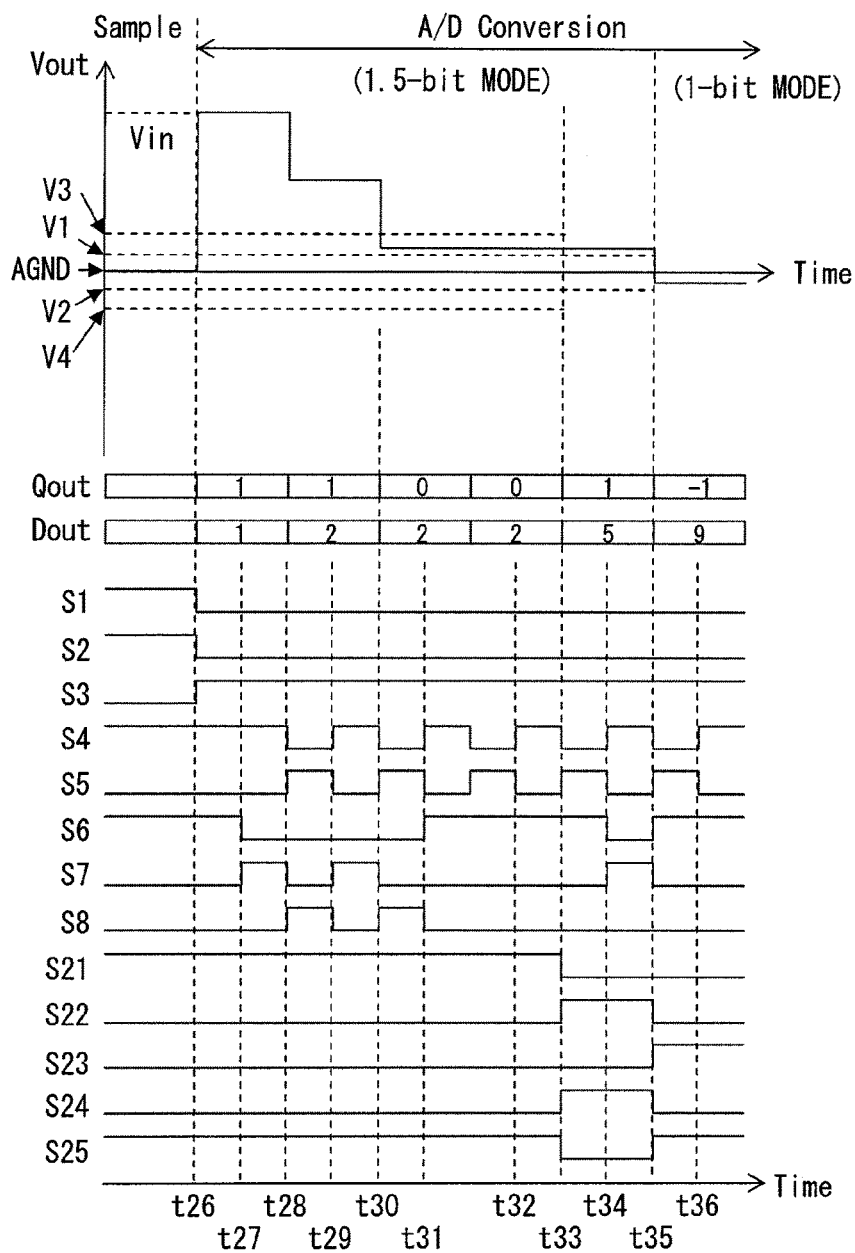
FIG. 9 is a timing chart showing an A/D conversion operation in the A/D converter according to a fourth modification.

With reference to FIG. 9, the operation and a function effect of the A/D convertor 200 according to the present modification will be described. In regard to the period by the time t26 when the sampling completes, the operation by the time t26 is similar to the operation of the second embodiment by the time t15. Therefore, the explanation will be omitted. According to the embodiment, threshold voltages the V1 to the V5 inputted to the comparator 22 and 23 are set as follows: V1=Vp/16; V2=Vm/16; V3=Vp/8; V4=Vm/8; and V5=AGND=0V.

Before a time t31, the threshold voltage of the first comparator 22 of the quantizer 20 is set to be the V3, and the threshold voltage of the second comparator 23 is set to be the V4. Therefore, the switch S21 and the switch S25 turn on and the switch S22 to S24 turn off. That is, in the period from the time t26 to the time t31, in comparison to the second embodiment, the difference between the two threshold voltages is set to be larger.

As shown in FIG. 9, at a time t27 in which the threshold voltages are set to be the V3 and the V4, similar to the second modification, the switch S6 is turned off and also the switch S7 is turned on. At the time t28, the switch S7 is turned off and the switch S8 is turned on while the switch S6 remains in the off state. Thereby, the electric charge corresponding to the potential difference (=Vp−Vm) before and after a time t28 and capacity value of the DAC capacitor C2 is transferred to the integration capacitor C1. The voltage corresponding to the residual of the A/D conversion is outputted as the output voltage Vout of the operational amplifier 11. It is supposed that the capacity value of the DAC capacitor C2 is equal to the second embodiment, the amount of the subtraction of the electric charge from the integration capacitor C1 by one time of the subtraction becomes doubles in comparison with the second embodiment.

In the first quantization cycle from the time t26 to the time t28, the relation Vout>V3 is satisfied, and the relation Qout=1 and Dout=1 are satisfied. Similarly, in the second quantization cycle from the time t28 to a time t30, Vout>V3 is satisfied, and Qout=1 and Dout=2 are satisfied. In addition, by the time when a predetermined quantization cycle is completed without depending on the level of the input signal Vin, in other words, by a time t31 that the 4 cycles of the quantization in the example of FIG. 9, the quantization is performed while keeping the threshold voltages V3, V4.

In the period from the time t30 to a time t33, the relation V4<Vout<V3 is satisfied, so that the relation Qout=0 is satisfied. Therefore, similar to the operation at and after the time t21 in the second modification, in the period from the time t31 to a time t34, the switch S6 is turned on, and also the switch S7 and S8 are turned off. That is, the subtraction of the electric charge of the integration capacitor C1 is not performed substantially. Since Qout=0 is satisfied, the relation Dout=2 remains. When the resolution obtained by the time t33 is N bit, the number of the quantization cycle by the time t33 is, similar to the second modification, 2N−1 cycles. That is, at the time t33 that 4 times of the quantization of are completed, the resolution of the A/D conversion of 3 bits (9 gradations) can be obtained.

At the time t33, the switch S21 is turned off and the switch S22 is turned on. That is, the threshold voltage of the first comparator 22 in the quantizer 20 is switched from the V3 to the V1. Similarly, the switch S25 is turned off and the switch S24 is turned on. That is, the threshold voltage of the second comparator 23 in the quantizer 20 is switched from the V4 to the V2. In the period from a time t32 to a time t34, the Vout is unchanged and, similar to the second modification, the subtraction is performed in a state where the DAC voltage Vdac is set to be AGND.

As shown in FIG. 9, in the period from a time t33 to the time t35, the relation Vout>V1 is satisfied, so that Qout=1 is satisfied. Here, the difference between the two threshold voltages in the quantizer 20 is switched to ½ of at and before the time t33. The magnitude of the 1 gradation of the quantization result Qout of the quantizer 20 becomes ½ in comparison to at and before the time t33. Therefore, the logic circuit 24 doubles the A/D conversion result Dout=2 at and before the time t33 and adds the Qout=−1 from the time t33 to a time t35. That is, in the period from the time t33 to the time t35, Dout=5 is satisfied.

By the time t35 when 5 cycles of the quantization are completed, the resolution of the A/D conversion of 4 bits (17 gradations) is obtained. When the process of the A/D conversion is completed at the time t35, the quantization before obtaining the A/D conversion result Dout similar to the second embodiment is 5 times of the quantization. It may be possible to reduce as compared with 8 cycles according to the second embodiment. Therefore, in comparison to the second embodiment, it may be possible to increase a processing speed of the A/D conversion.

According to the present modification, at and after the time t35, similar to following the time t25 of the third modification, the last quantization is performed by operating the quantizer 20 in the 1 bit mode. At and after the time t35, the relation Vout<AGND is satisfied, and Qout=−1 is obtained. Furthermore, Dout=5 immediately before the time t35 is doubled, and Qout=−1 at and after the time t35 is added. Thereby, Dout=9 is obtained as the final A/D conversion result of the input signal Vin.

According to the example of FIG. 9, 6 cycles of the quantizations and 5 cycles of the subtractions are performed. Therefore, the resolution of the A/D conversion is 5 bits (32 gradations). When the desired resolution of the A/D conversion is N bit, the subtraction of the electric charge needs 2N−3+1 cycles and the quantization needs 2N−3+2 cycles. Therefore, when the resolution N is high, it may be possible to reduce to approximately half the number of cycle needed to obtain the resolution corresponding to the third modification. Due to reduction of the number of cycles of the subtraction, it may be possible to reduce the effect of the thermal noise increasing by performing the subtraction or the flicker noise on the A/D conversion result.

The quantizer 20 according to the present modification changes, in the period from the time t26 to the time t35, each of two threshold voltages of the quantizer 20 at the time t33. However, the quantizer 20 functions as the 1.5 bit quantizer. After the time t35, the quantizer 20 functions as the 1 bit quantizer using the threshold voltage as AGND.

(Fifth Modification)

According to the second embodiment and the second modification to the fourth modification, the example of the quantizer 20 using 1.5 bit or 1 bit has been described. By contrast, according to the present modification, the example that provides the quantization of 2.5 bits (5 levels) by the quantizer 20 as shown in FIG. 7 and as described in the third modification will be described.

The quantizer 20 of the A/D convertor 200 according to the modification, in the quantization of 1 cycle, the threshold voltage is changed each half quantization cycle, and the DAC 30 is controlled by the quantization result Qout of each of the half quantization cycle. That is, the quantizer 20 of 1.5 bits is used and the quantization of 5 levels is performed by 1 quantization cycle. Thereby, the quantizer of actual 2.5 bits is provided.

Figure 10:
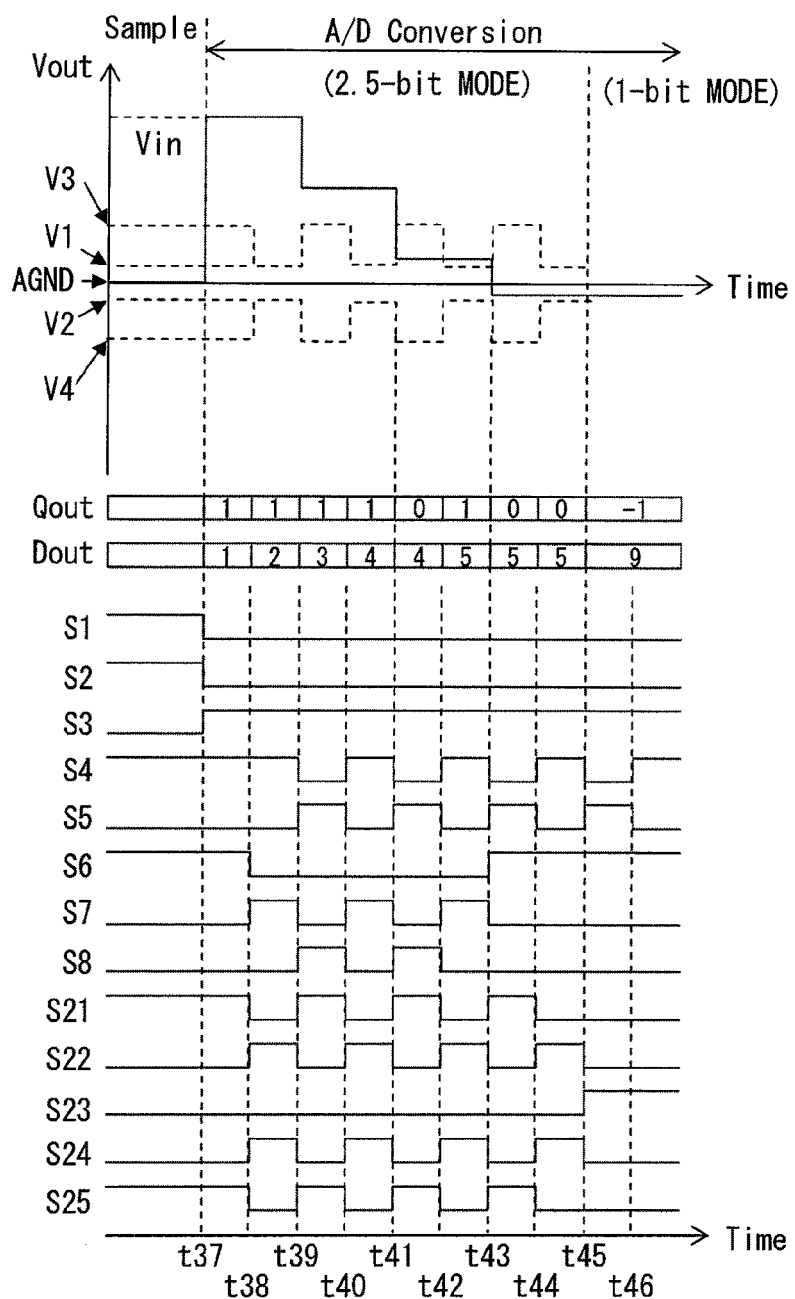
FIG. 10 is a timing chart showing an A/D conversion operation in the A/D converter according to a fifth modification.

In particular, as shown in FIG. 10, in the first half of the quantization cycle, the threshold voltage of the first comparator 22 is set to be the V3, and the threshold voltage of the second comparator 23 is set to be the V4. In the second half of the quantization cycle, the threshold voltage of the first comparator 22 is set to be the V1 and the threshold voltage of the second comparator 23 is set to be the V2. The twice quantizations are performed in 1 quantization cycle. The DAC 30 controls by using the each of two quantization results in once quantization cycle. In regard to the quantization result Qout, in the case of Vout>V1 or Vout>V3, Qout=1 is satisfied. In the case of V2<Vout<V1 or V4<Vout<V3, Qout=0 is satisfied. In the case of Vout<V2 or Vout<V4, Qout=−1 is satisfied.

The DAC voltage Vdac that drives the DAC 30 is determined based on the total value of the Qout in the 1 quantization cycle. In particular, in the case that the total value of the two quantization results of the Qout is 2, the potential difference in the first half and the second half of 1 subtraction cycles of the DAC voltage Vdac becomes Vp−Vm, and the subtraction is performed. Similarly, in the case that the total value of the two quantization results of the Qout is 1, the potential difference becomes Vp−AGND, in the case that total value of the two quantization results of the Qout is −1, the potential difference becomes Vm−AGND, in the case that the total value of the Qout=−2, the potential difference becomes Vm−Vp and the subtraction is performed. In the case that the total value of the Qout is 0, the DAC voltage Vdac becomes AGND, and the subtraction is not actually performed.

With reference to FIG. 10, the operation of the A/D convertor 200 according to the present modification will be described. the operation in the period until a time t37 when the sampling completes is similar to the period by the time until the time t15 described in the second embodiment. Therefore, the explanation will be omitted. According to the present modification, the threshold voltages V1 to V5 inputted to the comparator 22 and 23 are set to be V1=Vp/16, V2=Vm/16, V3=3Vp/16, V4=3Vm/16, and V5=AGND=0V.

As shown in FIG. 10, in regard to the output Vout of the operational amplifier 11 form the time t37 to a time t39, Vout>V3 and also Vout>V1 are satisfied. Therefore, two quantization results Qout in the first half and the second half from the time t37 to the t39 are 1 respectively. The total value of the Qout in 1 quantization cycle is 2. Hence, within the subtraction cycle from a time t38 to a time t40, similar to the operation that has been described in the second modification and the fourth modification, the switch S7 and the switch S8 of the DAC 30 are controlled, and the subtraction by using the potential difference Vp−Vm is performed. In the quantization cycle from the time t39 to the time t41, the total of the quantization cycle is 2, and Vout>V3 and Vout>V1 are satisfied. In the subtraction cycle from the time t40 to the time t42, the subtraction is performed by the potential difference Vp−Vm To sum up two quantization results Qout within 1 quantization cycle is not always necessary. The DAC voltage Vdac of the first half of the subtraction cycle may be determined only from the Qout of the second half of the cycle of the quantization cycle and the DAC voltage Vdac of the second half of the subtraction cycle may be determined only from the Qout of the second half of the cycle of the quantization cycle, so that the DAC 30 may be performed.

A timing when the total value 2 of the two Qout from the time t37 to the time t39 is reflected onto the subtraction is the subtraction cycle from the time t38 to the time t40. That is, in the subtraction cycle from the time t38 to the time t40, the switches S6 to S8 are controlled based on the Qout obtained from the time t37 to the time t39, and the subtraction is performed.

In the third quantization cycle from the time t41 to the time t43, in the first half, V4<Vout<V3 is satisfied (Qout=0) and also, in the second half, Vout>V1 is satisfied (Qout=1). Therefore, the total value of the Qout in the quantization cycle is 1, and the third subtraction from the time t42 to a time t44 is performed based on the potential difference Vp−AGND. That is, similar to the second embodiment, the switch S6 and the switch S7 of the DAC voltage Vdac control the DAC voltage Vdac to perform the subtraction.

In regard to the fourth quantization cycle from the time t37 to the time t39, in the first half, V4<Vout<V3 is satisfied (Qout=0) and also, in the second half, V2<Vout<V1 is satisfied (Qout=0). Therefore, the total value of the Qout in the quantization cycle is 0, and, in the last subtraction cycle from the time t44 to a time t46, the subtraction is not performed virtually. The A/D conversion result obtained by the time t45 when 4 cycles of the quantization completes is Dout=5, and the resolution of the A/D conversion is 4 (17 gradations).

According to the present modification, at and after the time t45, similar to the third modification and the fourth modification, the quantizer 20 is performed on the 1 bit mode, and the last quantization is performed. At and after the time t45, Vout<AGND is satisfied. Therefore, Qout=−1 is satisfied, Dout=5 is doubled immediately before the time t45 and then, the Qout is added. Thereby, the final A/D conversion result is Dout=9.

According to the example of FIG. 10, by the 5 times of the quantization cycles and 4 times of the subtraction cycles, the resolution of the A/D conversion of 5 bits (32 gradations) is obtained. When the desired resolution of the A/D conversion is N bit, the subtraction of the electric charge needs 2N−3 cycles and the quantization needs 2N−3+1 cycles. Therefore, when the desired resolution N is high, it may be possible to reduce to approximately half the number of cycles needed to obtain the resolution corresponding to the third modification. Similar to the fourth embodiment, it may be possible to reduce the effect of the thermal noise increasing by performing the subtraction or the flicker noise.

Third Embodiment

According to the second embodiment and the second modification to the fifth modification, the configuration using only the quantizer 20 to produce the A/D conversion result Dout has been described. By contrast, an A/D convertor 300 is configured so that a part of the quantization in the process of the A/D conversion is performed by another A/D convertor different from the quantizer 20. Hereinafter, the A/D convertor different from the quantizer 20 may be referred to as a sub-ADC 50. The sub-ADC may be referred to as a sub-analog digital convertor or another ADC.

First, with reference to FIG. 11, the schematic configuration of the A/D convertor 300 according to the embodiment will be described.

Figure 11:
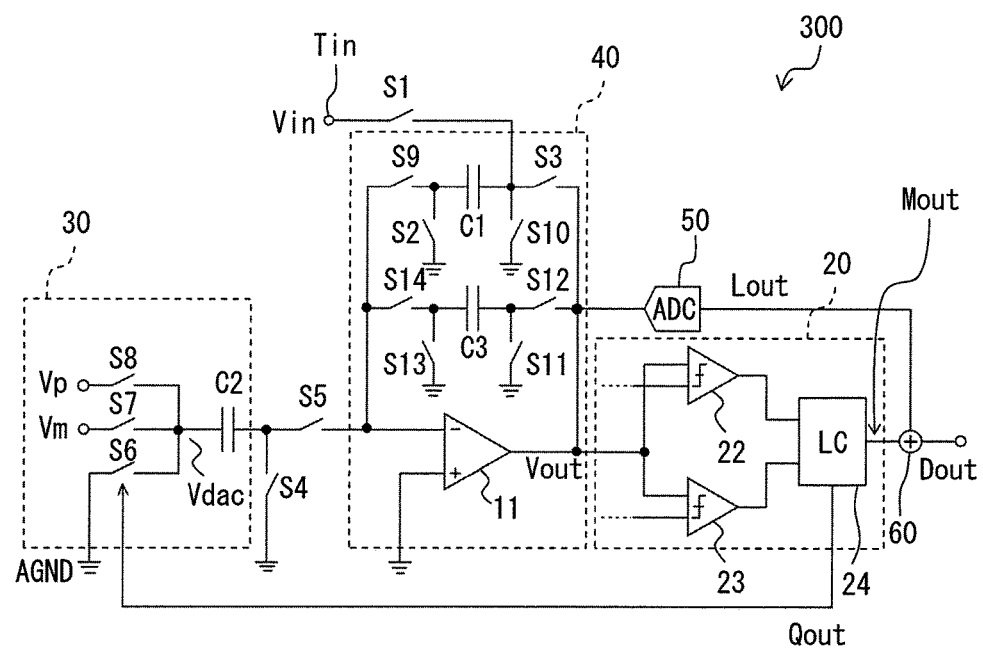
FIG. 11 is a circuit diagram showing a schematic configuration of an A/D converter according to a third embodiment.

As shown in FIG. 11, the A/D convertor 300 includes, in addition to the DAC 30, an integrator 40 and the quantizer 20, the sub-ADC 50 and an adder 60. The DAC 30 is similar to the fifth modification of the second embodiment. Therefore, the detailed explanation will be omitted. In FIG. 11, though the description of the specific configuration is omitted for simplification, the quantizer 20 has a configuration that uses a variable threshold voltage as shown in FIG. 7 similar to the fifth modification of the second embodiment.

The integrator 40 has the integration capacitor C1 and an amplification capacitor C3, and each of them is connected in parallel between the inverting input terminal and the output terminal of the operational amplifier 11.

A one end of the integration capacitor C1 is connected with the inverting input terminal of the operational amplifier 11 through a switch S9 and the other end is connected with the output terminal of the operational amplifier 11 through the switch S3. The middle point between the integration capacitor C1 and the switch S9 is connected with AGND through the switch S2. The middle point between the integration capacitor C1 and the switch S3 is connected with AGND through a switch S10.

The one end of the amplification capacitor C3 is connected with the inverting input terminal of the operational amplifier 11 through a switch S14 and the other end is connected with the output terminal of the operational amplifier 11 through the switch S12. The middle point between the amplification capacitor C3 and a switch S14 is connected with AGND through a switch S13. The middle point between the amplification capacitor C3 and the switch S12 is connected with AGND through a switch S11.

The input terminal Tin is connected with the middle point between the integration capacitor C1 and the switch S3 through the switch S1. Each of functions of the switch S2 and the switch S3 is similar to the functions of the switch S2 and the switch S3 according to the second embodiment.

The sub-ADC 50 is connected with the output terminal of the operational amplifier 11 in parallel to the quantizer 20. A digital output Lout of the sub-ADC 50 is inputted to the adder 60 with the digital output Mout of the quantizer 20. The adder 60 adds the Mout outputted from the quantizer 20 and the Lout outputted from the sub-ADC 50, and generates a final digital output Dout. The sub-ADC 50 may be an A/D convertor that is generally known.

Next, with reference to FIG. 12, the operation of the A/D convertor 300 according to the present embodiment will be explained.

(Sampling)

In the period of the sampling at and before a time t47, the switches S1, S2, S4, S6, S11 and S13 turn on, and the switches S3, S5, S7, S8, S9, S10, S12 and S14 turn off. Since the switch S3 turns off, the integration capacitor C1 and the output terminal of the operational amplifier 11 are electrically separated from each other. Since the switches S1, S2 turn on, the input signal Vin is sampled to the integration capacitor C1. Since the switches S11, S13 turn on and the switches S12, S14 turn off, the amplification capacitor C3 is electrically separated from the operational amplifier 11 and the both terminals are connected to AGND. Thereby, the amplification capacitor C3 is in a state that the electric charge is not accumulated.

Since the switch S4 and the switch S6 in the DAC 30 turn on, both of the terminals of the DAC capacitor C2 are connected with AGND. Thereby, the DAC capacitor C2 is in a state that the electric charge is not accumulated.

(A/D Conversion)

At the time t47, the switch S1 and S2 are turned off, the sampling of the Vin completes, the switch S3 and the switch S9 are turned on, and the Vout is outputted.

The operation from the time t47 to a time t48 is similar to the operation from the time t37 to the time t45 in the fifth modification of the second embodiment, and therefore, the detailed description will be omitted. The output Mout of the quantizer immediately before the time t48 of the fifth modification has the identical value with the output Dout immediately before the time t45 in the fifth embodiment, and Mout=5 is satisfied. By the time t48, the resolution of the A/D conversion obtained from the Mout is 4 bits (17 gradations). The quantizer 20 performs the A/D conversion corresponding to 4 bits of the high order in the A/D conversion result Dout of the embodiment.

At the time t48, the switches S3, S11, S13 are turned off, the switches S10, S12, S14 are turned on, and at the same time, the last subtraction is performed. Thereby, all electric charges corresponding to the residual of the A/D conversion is transferred to the amplification capacitor C3. Then, the residual Vout of the A/D conversion outputted from the operational amplifier 11 is amplified according to a rate between the integration capacitor C1 and the capacity value of the amplification capacitor C3, in comparison to the residual at and before the time t48. According to the example of FIG. 12, the residual of the A/D conversion has been amplified by 16 times. Consequently, the logic circuit 24 makes the A/D conversion result Mout by the time t48 in 16 times, and outputs Mout=80 as the A/D conversion result by the quantizer 20 at and before the time t48.

At and after a time t49, the sub-ADC 50 performs the A/D conversion to the residual Vout, which is amplified and outputted by the operational amplifier 11. According to the example of FIG. 12, the sub-ADC 50 outputs Lout=−4. The output Mout=80 of the quantizer 20 and the output Lout=−4 of the sub-ADC 50 are added by the adder 60. Thereby, a final A/D conversion result Dout=76 is obtained. In this way, by adding the A/D conversion result Mout corresponding to 4 bits of the high order from the quantizer 20 and an A/D conversion result Lout corresponding to 4 bits of the low order from the sub-ADC 50, the final A/D conversion result Dout obtains the resolution of 8 bits.

According to the A/D convertor 300 of the embodiment, at the time t48, all electric charges of the integration capacitor C1 is transferred to the amplification capacitor C3. Therefore, when the integration capacitor C1 is electrically separated from the operational amplifier 11, the output voltage of the operational amplifier 11 is maintained by the amplification capacitor C3. Therefore, at the time t49, the switches S9, S10 are turned off, the switches S1, S2 are turned on. Thereby, the integration capacitor C1 becomes electrically separated from the operational amplifier 11, and the integration capacitor C1 performs the sampling of the input signal Vin again.

Figure 12:
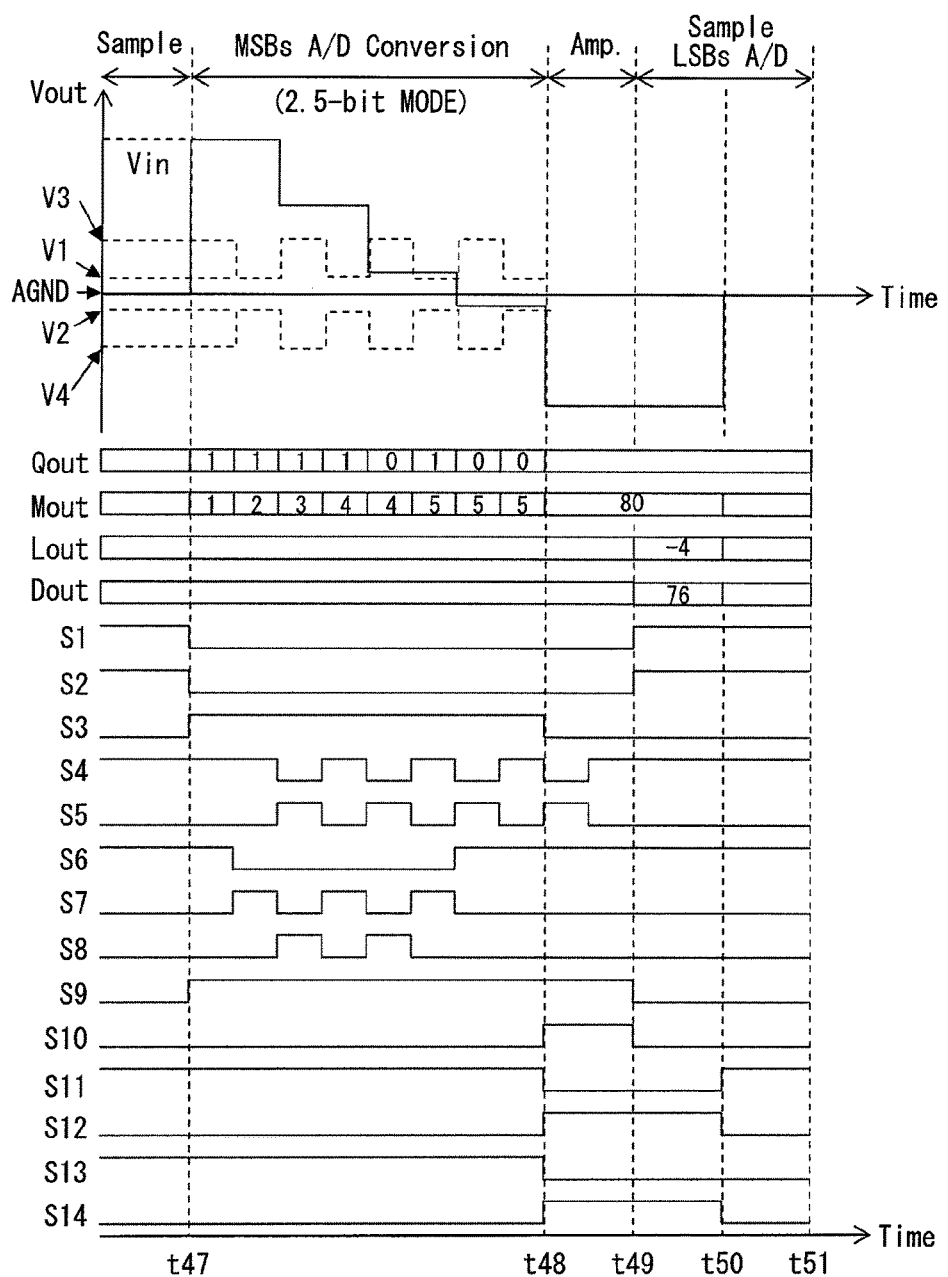
FIG. 12 is a timing chart showing an A/D conversion operation according to the third embodiment.

As shown in FIG. 12, in the period from the time t49 to the time t50, the sub-ADC 50 performs the A/D conversion of the low order bit that receives the residual of the A/D conversion related to a preceding A/D conversion. That is, the A/D conversion of the low order bit related to the preceding A/D conversion and the sampling of the input signal Vin related to a next A/D conversion are performed in parallel.

Next, the effect of the A/D convertor 300 according to the present embodiment will be described.

According to the second embodiment and the second modification to the fifth modification, when the A/D conversion resolution increases, the number of the cycles increases exponentially. Therefore, when the A/D conversion with high resolution is implemented, the conversion speed decreases greatly. By contrast, the A/D convertor 300 according to the present embodiment includes the sub-ADC 50 that performs the A/D conversion of the low order bit. In the quantizer 20, the number of the cycle increases exponentially in accordance with the increase of the resolution. It may be possible to reduce the resolution controlled by the A/D conversion of the high order bit performed by the quantizer 20, and to greatly reduce the number of the cycle required for the A/D conversion.

The A/D convertor 300 of the present embodiment has the amplification capacitor C3 as a different body, different from the integration capacitor C1. Therefore, during operation of the A/D conversion of the low order bit by the sub-ADC 50, the integration capacitor C1 is separated from the operational amplifier 11. Thereby, it may be possible to perform the sampling related to the next A/D conversion in parallel. In addition, also in the period of the A/D conversion of the high order bit related to the next A/D conversion at and after a time t51, the sub-ADC 50 is not used in the next A/D conversion, and therefore, it may be possible to perform the A/D conversion of the low order bit related to the preceding A/D conversion by using the sub-ADC 50. Therefore, it may be easy to secure of the processing time of the sampling of the input signal Vin and the A/D conversion of the low order bit by the sub-ADC 50, and it may be possible to increase a throughput of the whole A/D conversion.

In regard to the sub-ADC 50, it may be possible to use a general A/D convertor. When a nyquist A/D convertor that performs the A/D conversion by one time of the sampling is used as the sub-ADC 50 in order to increase the conversion speed, it may be possible to assign to the sub-ADC 50, the A/D conversion of the low order bit from approximately 10 to 12 bits while keeping conversion accuracy of the whole A/D conversion, without a high-accuracy technique such as trimming or the like. Thus, according to the present embodiment, it may be possible to suppress increase of the error of the A/D conversion resulting from conversion accuracy of the sub-ADC 50, and it may be possible to greatly reduce the number of cycles of the A/D conversion of the high order bit by the quantizer 20. It may be possible to greatly increase speed of the A/D conversion.

It may be possible to decrease the nonlinear error of the A/D conversion resulting from the ratio accuracy between the DAC capacitor C2 and the amplification capacitor C3 by increasing the resolution of the A/D conversion of the high order bit by the quantizer 20. Therefore, when the resolution such that the nonlinear error becomes sufficiently smaller than accuracy corresponding to the resolution assigned to the sub-ADC 50 is assigned to the A/D conversion of the high order bit, it may be possible to sufficiently reduce the effect of the nonlinear error of the A/D conversion of the high order bit on accuracy of the whole A/D conversion. For example, when the resolution of the whole A/D conversion is 16 bits, the resolution of 10 to 12 bits is assigned to the A/D conversion of the low order bit by the sub-ADC 50, and the resolution of 4 to 6 bit is assigned to the A/D conversion of the high order bit by the quantizer 20.

It may be possible to increase speed of the A/D conversion while keeping high accuracy without the high accuracy technique such as trimming or the like.

Fourth Embodiment

According to the third embodiment, the configuration in which the integrator 40 amplifies the residual of the A/D conversion by using the amplification capacitor C3 and the sub-ADC 50 performs the A/D conversion to the amplified residual is explained. By contrast, according to the present embodiment, as shown in FIG. 13, a configuration that the residual of the A/D conversion is amplified by using the DAC capacitor C2 without having the amplification capacitor C3 and the sub-ADC 50 performs the A/D conversion of the amplified residual will be explained.

Figure 13:
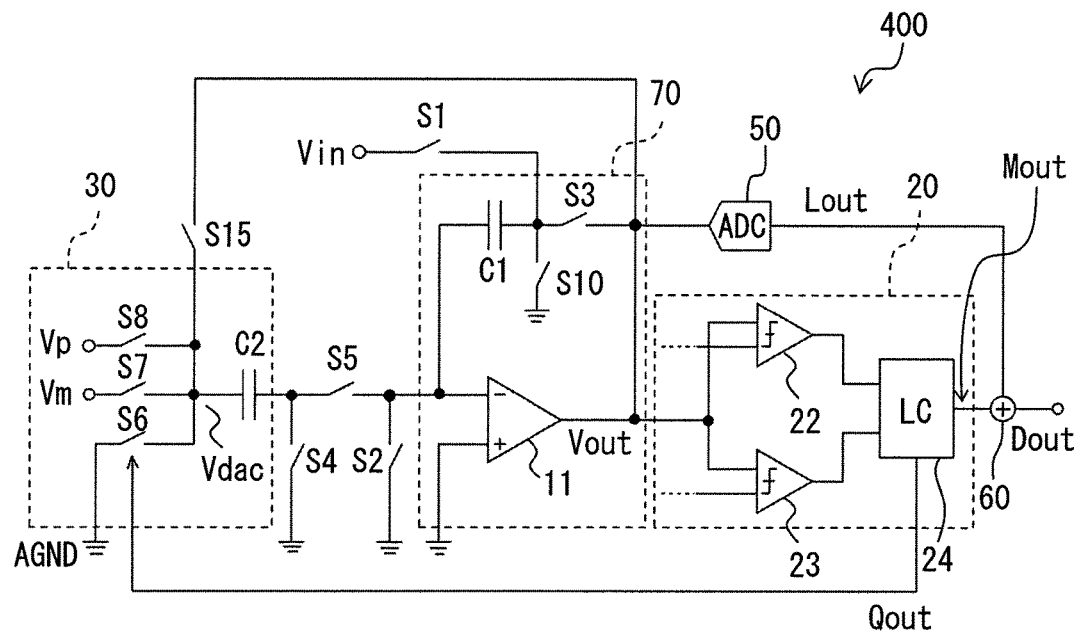
FIG. 13 is a circuit diagram showing a schematic configuration of A/D converter according to a fourth embodiment.

With reference to FIG. 13, the schematic configuration of the A/D convertor 400 according to the present embodiment will be explained.

As shown in FIG. 13, the A/D convertor 400 in the present embodiment includes an integrator 70, the quantizer 20, the DAC 30, the sub-ADC 50 and the adder 60. The DAC 30 is similar to each embodiment and each modification, and the specific explanation will be omitted. The quantizer 20 is similar to the third embodiment.

The integrator 70 according to the present embodiment has a switch S10 in addition to the integrator 10 in the second embodiment. The switch S10 is interposed between AGND and the middle point between the integration capacitor C1 and the switch S3. The switch S10 has an operation and function similar to the switch S10 in the third embodiment, and the switch is shown by the same code as the third embodiment In the A/D convertor 400, as shown in FIG. 13, the output terminal of the operational amplifier 11 in the integrator 70 and the middle point between the switches S6 to S8 in the DAC 30 and the DAC capacitor C2 are connected through a switch S15. Therefore, after the switches S1 to S4 and the switches S6 to S8 are turned off, the switch S5, the switch S10 and the switch S15 are turned on, and it may be possible to transfer the electric charge of the integration capacitor C1 to the DAC capacitor C2.

The A/D convertor 400 according to the present embodiment has a configuration similar to the A/D convertor 300 in the third embodiment other than the integrator 70 and the switch S15.

Figure 14:
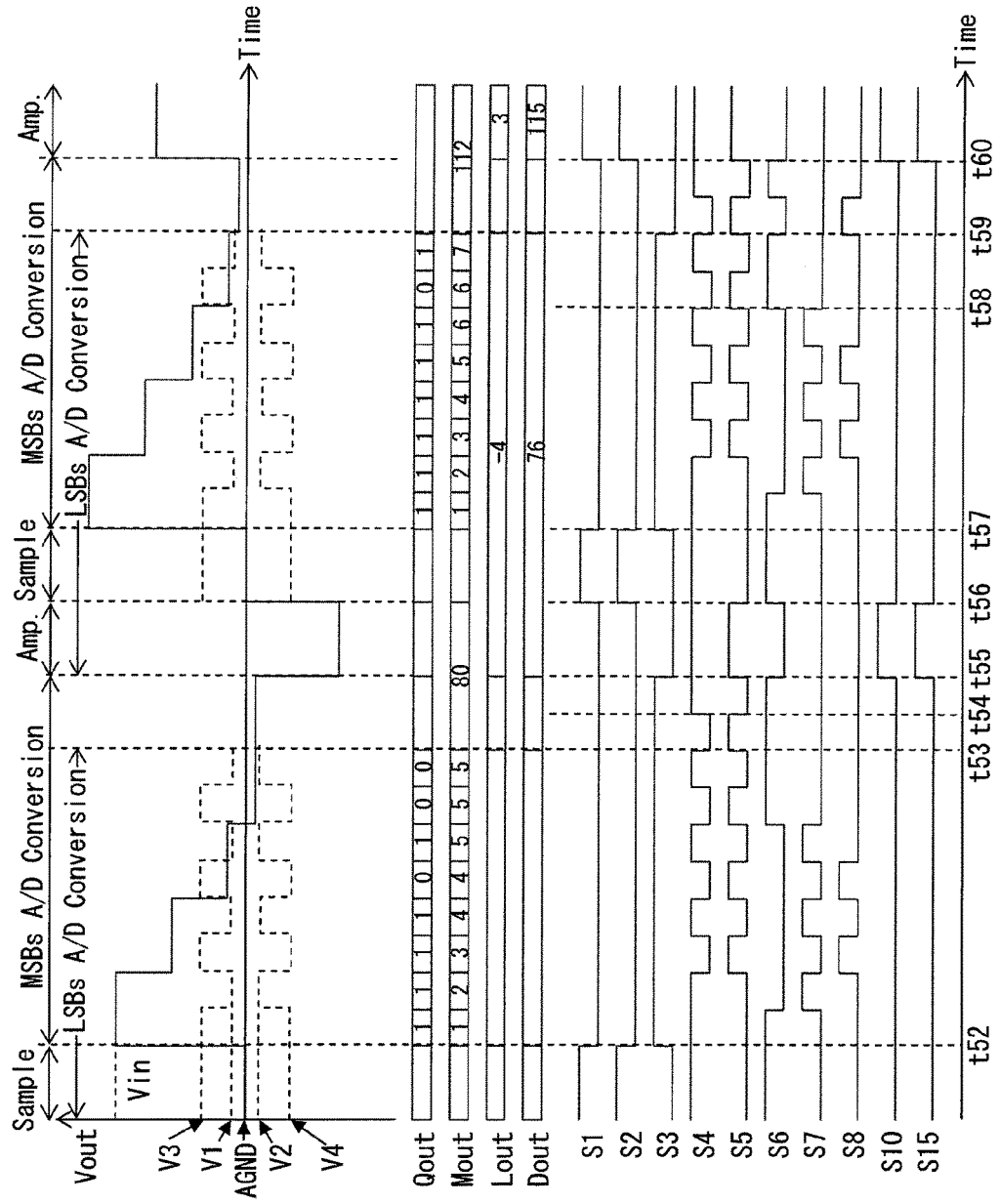
FIG. 14 is a timing chart showing an A/D conversion operation according to the fourth embodiment.

With reference to FIG. 14, the operation of the A/D convertor 300 according to the present embodiment will be explained.

(Sampling)

As shown in FIG. 14, in the period of the sampling at and before a time t52 and the period of the sampling from a time t55 to a time t56, the switch S10 and the switch S15 turn off. The operation is similar to the operation of the period of the sampling according to the fifth modification of the second embodiment, and the specific explain will be omitted.

(A/D Conversion)

At the time t52, the switch S1 and the switch S2 are tuned off to complete the sampling of the input signal Vin, and the switch S3 is turned on to output the Vout. The operation from the time t52 to a time t53 is similar to the operation from the time t47 to the time t51 according to the third embodiment. The specific explain will be omitted.

At the time t53, the switch S4 is turned off and the switch S5 is turned on, and the final subtraction is performed. At a time t54, the switch S5 is turned off and the switch S4 is turned on, the switch S6 is turned on, and the electric charge of the DAC capacitor C2 is reset. At the time t55, the switch S6 is turned off, the switches S10, S15 are turned on. All of the electric charge left in the integration capacitor C1 corresponding to the residual of the A/D conversion by the time t53 is transferred to the DAC capacitor C2, and the the residue of the A/D conversion is amplified.

At the time t48 of the third embodiment, the residue of the A/D conversion is amplified at the same time as the final subtraction. In the present embodiment, in order to perform the amplification of the residual by using the DAC capacitor C2 used in the subtraction, after the final subtraction completes at the time t54, the electric charge of the DAC capacitor C2 is reset, and then, the amplification of the residual starts at and after the time t55. In the period from the time t55 to the time t56, the amplified residual of the A/D conversion is transferred to the sub-ADC 50. The transferred residual is A/D converted by the sub-ADC 50 at and after the time t55. The operation that obtains the final A/D conversion result Dout=76 having the resolution of 8 bits from the output Mout of the quantizer 20 and the output Lout of the sub-ADC 50 is similar to the third embodiment, and the specific explain will be omitted.

At the time t56, the switch S10, S15 are turned off, and the switch S6 is turned on. By turning on the switches S1, S2 while remaining the switch S3 off, similar to the time t52 and before, the sampling according to the next A/D conversion starts by using the integration capacitor C1.

The period at and after a time t57 becomes the period of the A/D conversion of the high order bit by the quantizer 20 related to the next A/D conversion. The operation of the A/D convertor 400 is similar to the period from the time t52 to the time t56. In the period from the time t55 to the time t59, the sub-ADC 50 is unused in the next A/D conversion that is performed at and after the time t56. That is, in the period from the time t56 to the time t59, the A/D conversion of the low order bit related to the preceding A/D conversion, the sampling of the input signal Vin related to the next A/D conversion and the A/D conversion of the high order are performed in parallel.

Next, the effect of the A/D convertor 400 according to the embodiment will be explained.

The A/D convertor 400 includes the sub-ADC 50 that performs the A/D conversion of the low order bit. Therefore, similar to the third embodiment, it may be possible to reduce the number of cycles necessary for the A/D conversion of high order bit by the quantizer 20.

When the residual of the A/D conversion is transferred to the sub-ADC 50, similar to the third embodiment, the A/D convertor 400 according to the present embodiment can perform the A/D conversion of the low order bit by the sub-ADC 50, the sampling related to the next A/D conversion, and the A/D conversion of the high order bit in parallel. Hence, it may be possible to increase the throughput of the A/D conversion.

The DAC capacitor C2 of the present embodiment is configured so as to function as the amplification capacitor C3 according to the third embodiment. Therefore, it may be possible to reduce the number of required capacitance elements, and the nonlinear error of the A/D conversion resulting from the ratio accuracy of the capacity value between the DAC capacitor C2 and the amplification capacitor C3.

Other Embodiments

In the above, preferable embodiments of the present disclosure are explained. However, the present disclosure is not limited to the embodiments described above, and can be modified as appropriate. It may be possible to perform the present disclosure by a verified combination in the field not over the point present disclosure.

According to each embodiment and each modification, the example as the A/D conversion of the predetermined number of the bit such as 4 bits or 8 bits was explained. However, it may be possible to the A/D convertor 100 to 400 to an arbitrary bit number.

According to each embodiment and each modification, in the period of the sampling of the input signal Vin, the configuration that each switch operates so that the reset of the DAC capacitor C2 or of the amplification capacitor C3 are performed has been exemplified. However, it may be possible to set optionally the operations of each switch in the field not over the point present disclosure.

According to each embodiment, the example that the operational amplifier 11 of the single end is uses as the amplifier to simplify was explained. However, it may be possible to configure the A/D convertor 100 to 400 by using a differential operational amplifier instead of the operational amplifier of the single end too.

In the above, the embodiment, the configuration, an aspect of the A/D converter related to the present disclosure are exemplified. However, the present disclosure is not limited to each embodiment, each configuration and each aspect relate to the present disclosure are exemplified. For example, the field of the embodiment, the configuration, an aspect of the A/D converter related to the present disclosure includes the embodiment, the configuration, an aspect obtained by accordingly combining each of technical part disclosed in different embodiment, configuration and aspect.

The invention claimed is:

1. An A/D convertor to convert an analog signal into a digital value comprising:
an integrator that includes
an operational amplifier including a first input terminal and an output terminal, and
an integration capacitor being inserted between the first input terminal and the output terminal of the operational amplifier;
a quantizer that outputs a quantization result of quantizing an output signal of the operational amplifier;
a DAC that is connected with the first input terminal of the operational amplifier and determines based on the quantization result, a DAC voltage to perform a subtraction of an electric charge accumulated in the integration capacitor; and
a sub-ADC that is connected to the output terminal of the operational amplifier and is connected to the quantizer in parallel,
wherein:
the integrator has a feedback switch that turns on and off a connection that connects the integration capacitor and the output terminal of the operational amplifier to each other;
the analog signal as input signal is inputted between the integration capacitor and the feedback switch;
the integration capacitor in a state that the feedback switch turns off samples the analog signal;
the quantizer performs a quantization based on an output of the operational amplifier;
the DAC sequentially subtracts the electric charge accumulated in the integration capacitor based on the quantization result, and converts the analog signal to a digital value; and
the quantizer includes a comparator and a logic circuit.

2. The A/D convertor according to claim 1, wherein:
the DAC includes, as the DAC voltage, an analog ground level, a high level voltage set to be higher than a potential of the analog ground level, and a low level voltage set to be lower than the potential of the analog ground level.

3. The A/D convertor according to claim 2, wherein:
the DAC includes an operation mutually switching between the high level voltage and the low level voltage over the analog ground level when the DAC voltage is switched based on the quantization result.

4. The A/D convertor according to claim 2, wherein:
the DAC prevents the DAC voltage from changing from the analog ground level when the DAC voltage is switched based on the quantization result.

5. The A/D convertor according to claim 1, wherein:
the quantizer outputs the quantization result with a resolution of at least 1.5 bit.

6. The A/D convertor according to claim 1, wherein:
the comparator of the quantizer compares an output signal of the operational amplifier with a threshold voltage; and
the threshold voltage is changeable.

7. The A/D convertor according to claim 6, wherein:
the quantizer makes resolution of the quantizer changeable by making the threshold voltage changeable.

8. The A/D convertor according to claim 6, wherein:
the quantizer performs a plurality of quantizations while changing the threshold voltage made changeable each time of the subtraction of the electric charge accumulated in the integration capacitor by the DAC.

9. The A/D convertor according to claim 1, wherein:
the subtraction of the electric charge accumulated in the integration capacitor is repeated for a predetermined number of cycles without depending on the analog signal.

10. The A/D convertor according to claim 9, wherein:
after repeating the subtraction of the electric charge for the predetermined number of cycles, the quantizer in which a residual left in the integration capacitor is set to 1 bit performs A/D conversion and produces a least significant bit.

11. The A/D convertor according to claim 1,
wherein:
a high order bit of the digital value is produced through the quantizer; and
a low order bit of a remaining digital value is produced through the sub-ADC.

12. The A/D convertor according to claim 11, wherein:
the integrator includes an amplification capacitor connected with the integration capacitor in parallel between the first input terminal and the output terminal of the operational amplifier; and
after a residual left in the integration capacitor following production of the high order bit is transferred and amplified, the sub-ADC produces the low order bit.

13. The A/D convertor according to claim 11, wherein:
the DAC includes a DAC capacitor that is connected to the first input terminal and that accumulates an electric charge corresponding to the DAC voltage; and
after the residual left in the integration capacitor following production of the high order bit is transferred to the DAC capacitor and is amplified, the sub-ADC produces the low order bit.

14. The A/D convertor according to claim 12, wherein:
after the high order bit is produced, the integration capacitor is electrically separated from the operational amplifier.

15. The A/D convertor according to claim 14, wherein:
after the high order bit is produced, the analog signal related to a next A/D conversion is sampled in the integration capacitor in parallel with A/D conversion of the sub-ADC.

16. The A/D convertor according to claim 11, wherein:
after the residual left in the integration capacitor following production of the high order bit is transferred to the sub-ADC, in parallel with A/D conversion of the low order bit in the sub-ADC, the analog signal related to a next A/D conversion is sampled or an A/D conversion of the high order bit related to a next A/D conversion is performed.

\* \* \* \* \*